United States Patent [19]
Miller et al.

[11] Patent Number: 5,627,995
[45] Date of Patent: *May 6, 1997

[54] DATA COMPRESSION AND DECOMPRESSION USING MEMORY SPACES OF MORE THAN ONE SIZE

[75] Inventors: William D. Miller; Gary L. Harrington, both of Colorado Springs, Colo.; Larry M. Fullerton, Chandler, Ariz.; E. J. Weldon, Jr., Honolulu, Hi.; Chris M. Bellman, Colorado Springs, Colo.

[73] Assignee: Alfred P. Gnadinger, Colorado Springs, Colo.

[*] Notice: The term of this patent shall not extend beyond the expiration date of Pat. No. 5,490,260.

[21] Appl. No.: 251,465

[22] Filed: Jun. 1, 1994

Related U.S. Application Data

[63] Continuation-in-part of Ser. No. 679,530, Apr. 2, 1991, Pat. No. 5,490,260, which is a continuation of Ser. No. 627,722, Dec. 14, 1990, abandoned.

[51] Int. Cl.⁶ .................................................. G06F 12/00
[52] U.S. Cl. ...................... 395/497.02; 395/497.03; 395/888; 395/185.07; 395/414
[58] Field of Search .......................... 395/497.01, 497.02, 395/477.03, 888, 182.04, 185.07, 414, 415, 464, 421.03; 364/200 MS File, 900 MS File; 371/40.1

[56] References Cited

U.S. PATENT DOCUMENTS

| | | | |
|---|---|---|---|
| 4,001,786 | 1/1977 | Boehm | 395/497.02 |
| 4,054,951 | 10/1977 | Jackson et al. | 395/185.01 |
| 4,602,333 | 7/1986 | Komori | 364/413.13 |
| 4,809,234 | 2/1989 | Kuwashiro | 365/230.03 |
| 4,955,066 | 9/1990 | Notenboom | 382/240 |
| 5,175,834 | 12/1992 | Sawai | 395/478 |
| 5,337,319 | 8/1994 | Furukawa et al. | 395/182.01 |
| 5,406,280 | 4/1995 | Cogan et al. | 341/51 |
| 5,463,476 | 10/1995 | Oya | 358/426 |
| 5,490,260 | 2/1996 | Miller et al. | 395/427 |

FOREIGN PATENT DOCUMENTS 1169776  7/1989  Japan.

OTHER PUBLICATIONS

*Data Tape Drive to Battle 8 mm Tape Drive Head to Head Data Storage Report,* Elsevier Advanced Technology Publications, Oct. 1990.

Vaughan–Nichols, Steven J., Zippity PKzip, PC–Computing, v. 3, n. 2, p. 96(4) Feb., 1990.

*Primary Examiner*—Matthew M. Kim
*Attorney, Agent, or Firm*—Davis, Graham & Stubbs, LLP

[57] ABSTRACT

A method for storing data in a memory, including compressing fixed-sized pages of data, and storing the compressed pages into available smaller memory spaces on a medium if the compressed page will fit into such space, or storing the compressed pages onto available larger memory spaces on the medium, if the compressed page will not fit into the smaller space.

3 Claims, 16 Drawing Sheets

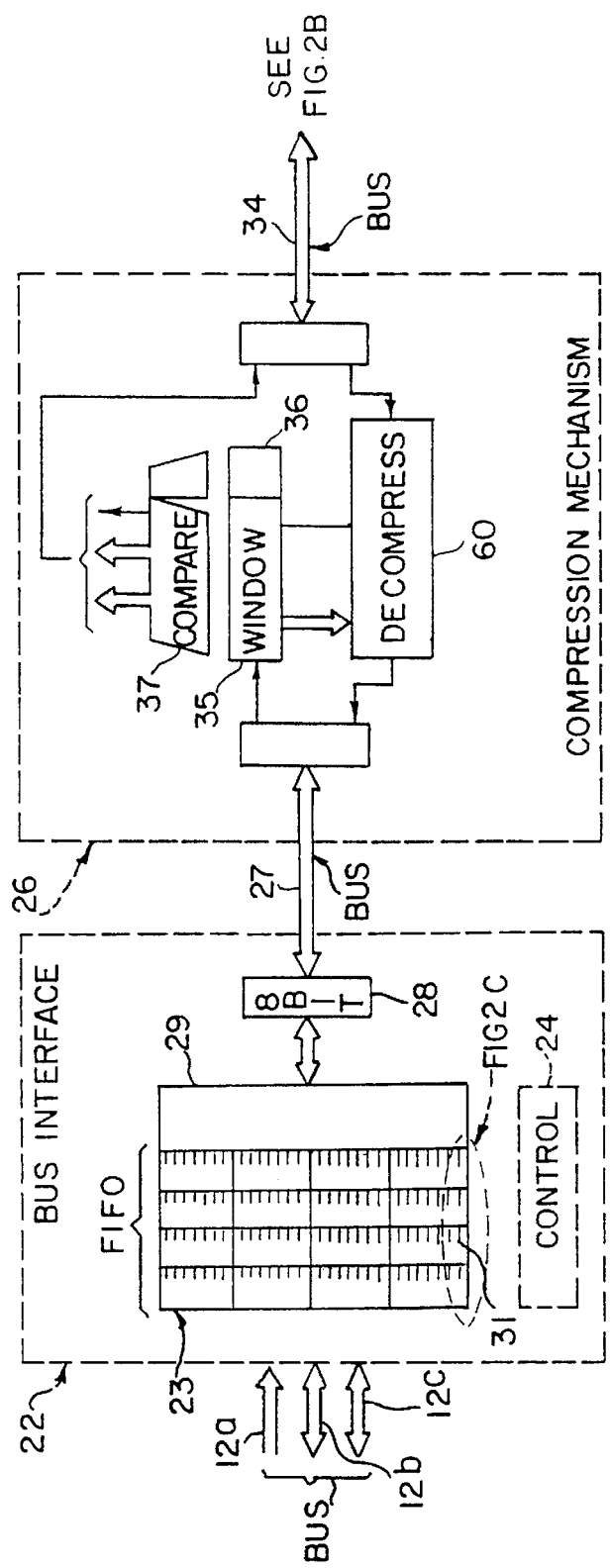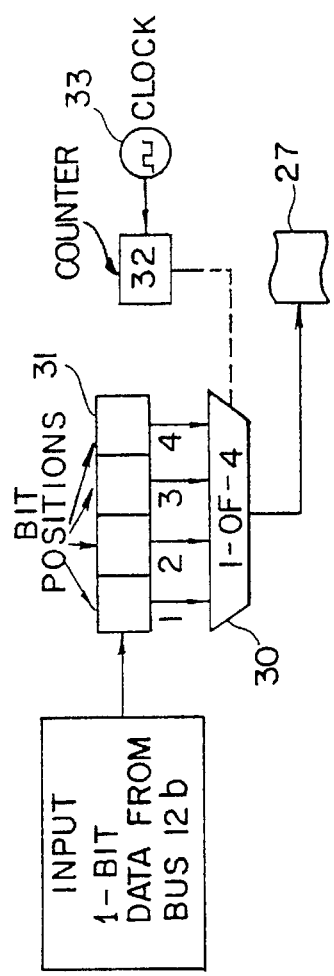

| Clk | WINDOW BUFFER | | | | Look Ahead Buffer | hex out | Match |
|---|---|---|---|---|---|---|---|
| 1  | 00000000 | 00000000 | 00000000 | 00000000 | THIS | 054 | No |
| 2  | 00000000 | 00000000 | 00000000 | 0000000T | HIS_ | 048 | No |
| 3  | 00000000 | 00000000 | 00000000 | 000000TH | IS_I | 049 | No |
| 4  | 00000000 | 00000000 | 00000000 | 00000THI | S_IS | 053 | No |
| 5  | 00000000 | 00000000 | 00000000 | 0000THIS | _IS_ | 05F | No |
| 6  | 00000000 | 00000000 | 00000000 | 000THIS_ | IS_T | 10A | Yes-3 |
| 7  | 00000000 | 00000000 | 00000000 | 00THIS_I | S_TE | --- | -- |
| 8  | 00000000 | 00000000 | 00000000 | 0THIS_IS | _TES | --- | -- |
| 9  | 00000000 | 00000000 | 00000000 | THIS_IS_ | TEST | 054 | No |
| 10 | 00000000 | 00000000 | 0000000T | HIS_IS_T | EST_ | 045 | No |
| 11 | 00000000 | 00000000 | 000000TH | IS_IS_TE | ST_A | 053 | No |
| 12 | 00000000 | 00000000 | 00000THI | S_IS_TES | T_A_ | 054 | No |
| 13 | 00000000 | 00000000 | 0000THIS | _IS_TEST | _A__ | 05F | No |
| 14 | 00000000 | 00000000 | 000THIS_ | IS_TEST_ | A__T | 041 | No |
| 15 | 00000000 | 00000000 | 00THIS_I | S_TEST_A | __TH | 05F | No |
| 16 | 00000000 | 00000000 | 0THIS_IS | _TEST_A_ | _THI | 11D | Yes-2 |
| 17 | 00000000 | 00000000 | THIS_IS_ | TEST_A__ | THIS | --- | -- |
| 18 | 00000000 | 0000000T | HIS_IS_T | EST_A__T | HIS_ | 13F | Yes-4 |
| 19 | 00000000 | 000000TH | IS_IS_TE | ST_A__TH | IS_I | --- | -- |
| 20 | 00000000 | 00000THI | S_IS_TES | T_A__THI | S_IS | --- | -- |
| 21 | 00000000 | 0000THIS | _IS_TEST | _A__THIS | _IS_ | --- | -- |
| 22 | 00000000 | 000THIS_ | IS_TEST_ | A__THIS_ | IS_T | 13F | Yes-4 |
| 23 | 00000000 | 00THIS_I | S_TEST_A | __THIS_I | S_TE | --- | -- |
| 24 | 00000000 | 0THIS_IS | _TEST_A_ | _THIS_IS | _TES | --- | -- |
| 25 | 00000000 | THIS_IS_ | TEST_A__ | THIS_IS_ | TEST | --- | -- |
| 26 | 0000000T | HIS_IS_T | EST_A__T | HIS_IS_T | EST_ | 13F | -- |
| 27 | 000000TH | IS_IS_TE | ST_A__TH | IS_IS_TE | ST_B | --- | -- |
| 28 | 00000THI | S_IS_TES | T_A__THI | S_IS_TES | T_B_ | --- | -- |
| 29 | 0000THIS | _IS_TEST | _A__THIS | _IS_TEST | _B__ | --- | -- |
| 30 | 000THIS_ | IS_TEST_ | A__THIS_ | IS_TEST_ | B__T | 042 | No |
| 31 | 00THIS_I | S_TEST_A | __THIS_I | S_TEST_B | __TH | 13F | Yes-4 |
| 32 | 0THIS_IS | _TEST_A_ | _THIS_IS | _TEST_B_ | _THI | --- | -- |
| 33 | THIS_IS_ | TEST_A__ | THIS_IS_ | TEST_B__ | THIS | --- | -- |
| 34 | HIS_IS_T | EST_A__T | HIS_IS_T | EST_B__T | HIS_ | --- | -- |
| 35 | IS_IS_TE | ST_A__TH | IS_IS_TE | ST_B__TH | IS_I | 131 | Yes-2 |
| 36 | S_IS_TES | T_A__THI | S_IS_TES | T_B__THI | S_IS | --- | -- |

FIG.4

| door | pop | cap | eff | front | back | screen | window |
|------|-----|-----|-----|-------|------|--------|--------|
| 20 | 24 | | | | | | |
| 21 | | | | | | | |
| 22 | | | | | | | |
| 23 | | | | | | | |
| 24 | 36 | 0.305 | | | | | |
| 25 | | | | | | | |
| 26 | | | | | | | |
| 27 | | | | | | | |
| ~~~ | ~~~ | ~~~ | ~~~ | ~~~ | ~~~ | ~~~ | ~~~ |
| 35 | | | | | | | |
| 36 | 46 | 0.415 | | | | | |
| 37 | | | | | | | |
| ~~~ | ~~~ | ~~~ | ~~~ | ~~~ | ~~~ | ~~~ | ~~~ |
| 45 | | | | | | | |
| 46 | 65 | 0.234 | | | | | |
| 47 | | | | | | | |
| ~~~ | ~~~ | ~~~ | ~~~ | ~~~ | ~~~ | ~~~ | ~~~ |
| 63 | | | | | | | |
| 64 | | | | | | | |
| 65 | 20 | 0.037 | | | | | |

FIG. 19

|    | door | pop   | cap   | eff   | front    | back     | screen | window |
|----|------|-------|-------|-------|----------|----------|--------|--------|
| 20 | 36   |       |       |       |          |          | 36     | 24     |
| 21 |      |       |       |       |          |          | 36     | 24     |
| 22 |      |       |       |       |          |          | 36     | 24     |
| 23 |      |       |       |       |          |          | 36     | 24     |
| 24 | 46   | 0.305 | 0.113 | 0.369 | 32329728 | 56082432 | 36     | 24     |
| 25 |      |       |       |       |          |          | 36     | 36     |
| 26 |      |       |       |       |          |          | 36     | 36     |
| 27 |      |       |       |       |          |          | 36     | 36     |
| ~~ | ~~   | ~~    | ~~    | ~~    | ~~       | ~~       | ~~     | ~~     |
| 35 |      |       |       |       |          |          | 36     | 36     |
| 36 | 24   | 0.415 | 0.230 | 0.554 | 0        | 32325632 | 36     | 36     |
| 37 |      |       |       |       |          |          | 36     | 46     |
| 38 |      |       |       |       |          |          | 36     | 46     |
| 39 |      |       |       |       |          |          | 24     | 46     |
| ~~ | ~~   | ~~    | ~~    | ~~    | ~~       | ~~       | ~~     | ~~     |
| 45 |      |       |       |       |          |          | 24     | 46     |
| 46 | 65   | 0.234 | 0.166 | 0.708 | 56086528 | 74309632 | 24     | 46     |
| 47 |      |       |       |       |          |          | 24     | 65     |
| 48 |      |       |       |       |          |          | 24     | 65     |
| 49 |      |       |       |       |          |          | 24     | 65     |
| 50 |      |       |       |       |          |          | 24     | 65     |
| 51 |      |       |       |       |          |          | 24     | 65     |
| 52 |      |       |       |       |          |          | 24     | 65     |
| 53 |      |       |       |       |          |          | 46     | 65     |
| ~~ | ~~   | ~~    | ~~    | ~~    | ~~       | ~~       | ~~     | ~~     |
| 62 |      |       |       |       |          |          | 46     | 65     |
| 63 |      |       |       |       |          |          | 46     | 65     |
| 64 |      |       |       |       |          |          | 65     | 65     |
| 65 | 20   | 0.037 | 0.037 | 1.000 | 74313728 | 77189120 | 65     | 65     |

FIG. 20

DATA COMPRESSION AND DECOMPRESSION USING MEMORY SPACES OF MORE THAN ONE SIZE

RELATED CASE

This application is in part a continuation of Ser. No. 679,530 filed Apr. 2, 1991, now U.S. Pat. No. 5,490,260, which is a continuation of application Ser. No. 627,722, filed Dec. 14, 1990, now abandoned.

BACKGROUND OF THE INVENTION

This invention relates to digital data storage and retrieval, and more particularly to page-oriented storing of compressed or uncompressed data in randomly-accessed locations of fixed sizes in partitioned storage devices. The invention is particularly adapted for storing fixed-size pages swapped with main memory in a computer system using a virtual memory management scheme.

A computer implementing a virtual memory system typically employs a certain amount of "physical" memory composed of relatively fast semiconductor Random Access Memory (RAM) devices, along with a much larger amount of "virtual" memory composed of hard disk, where the access time of the hard disk is perhaps several hundred times that of the RAM devices. The physical memory or "main memory" in a virtual memory system is addressed as words, while the virtual "disk memory" is addressed as pages. The virtual memory management scheme uses an operating system such as UNIX™ along with hardware including a translation buffer, as is well known. In multi-tasking operation where more than one program runs at the same time, each running in a time slice of its own, each program appears to have an entire memory space to itself. To make room in the physical memory to run a new program, or to allocate more memory for an already-running program, the memory management mechanism either "swaps" out an entire program (process) to disk memory or "pages" out a portion (page) of an existing process to disk. A typical page size is 4 Kilobytes (Kbytes).

Transferring data to and from disk memory is very slow compared to the transfer time to main memory, and so "solid state disks" (composed of semiconductor RAMs like the main memory) have been used as a substitute for magnetic disk to improve system performance. This is at a much higher cost per megabyte of storage, however, due to the cost of semiconductor RAMs. Data compression has not been used because of the variable-length record problem as discussed below, i.e., compressed data blocks are of variable size, making random access of compressed "pages" of data impractical.

As explained in application Ser. No. 627,722, data compression encoding algorithms are commonly applied to data which is to be archived or stored at the tertiary storage level. In a hierarchy of data storage, a RAM directly accessed by a Central Processing Unit (CPU) is often referred to a the primary level, the hard disk as the secondary level, and tape (back up) as the tertiary level. The characteristic of tertiary level storage as commonly implemented which supports use of compression is that the data access is largely sequential. Data is stored in variable-length units, sequentially, without boundaries or constraints on the number of bytes or words in a storage unit. Thus, if a file or page being stored compresses to some arbitrary number of bytes this can be stored as such, without unused memory due to fixed sizes of storage units. Compression can be easily applied in any such case where the data is not randomly accessed but instead is sequentially accessed. For this reason, data compression works well for data streaming devices such as magnetic tape. It has been applied to databases holding very large records on magnetic and optical disks.

Data compression is not readily adaptable for use with random access storage devices such as hard disks or solid-state disks, although in many cases it would be desirable to do so. The reason for this lack of use of data compression is that algorithms for data compression produce compressed data units which are of variable size. Blocks of data of fixed size compress to differing sizes depending upon the patterns of characters in the blocks; data with large numbers of repeating patterns compress to a greater degree than a more random distribution of characters. Text files and spreadsheet files compress to smaller units than executable code or graphics files. This problem of variable-length records has made random access of compressed data records, as managed by operating systems and controllers in computer systems, impractical.

It is the principal object of this invention to provide a low-cost, high-speed, semiconductor memory device useful in a computer implementing page swapping, as required in virtual memory computer architecture, particularly a device employing data compression to reduce cost, and using error detecting and correcting techniques to increase reliability. Another object is to provide an improved method of storing data in a computer system or the like, and particularly to provide a method of compressing data pages for storage in a storage medium having an access capability for storing data units of fixed size. Another object is to provide an improved data compression arrangement using a random-access type of storage device, where the data units to be stored and recalled are of fixed length and the storage device is accessed in fixed-length increments, where the length is small enough for this to be considered random access of data. A further object is to reduce the amount of unused storage space in a storage device when compressed data units are stored, and therefore increase the storage density. An additional object is to provide an improvement in the cost per byte of storage capacity in a storage device.

SUMMARY OF THE INVENTION

In accordance with one embodiment of the invention, a solid-state memory unit for page-swap storage employs data compression in which compressed data partitions are provided in Dynamic Random Access Memory (DRAM) memory for at least two different compressed data sizes. Data that will not compress to the block sizes specified for compressed data is stored uncompressed, in another partition in the DRAM memory, for example. As set for in application Ser. No. 627,722, a storage arrangement for compressed data may advantageously use multiple partitions, where each partition is a section of available physical storage space having an address known to the system which differentiates it from other partitions. The data to be stored is in blocks, i.e., units of data of some fixed size, as distinguished from byte or word oriented data of variable length. The partitions are capable of holding multiple blocks, each randomly accessible. The data blocks may be compressed if the compressed size fits in the fixed block size of one of the partitions in the storage device. To accommodate data which is compressible to a varying degree, yet avoid waste of unused space in the partitioned memory device, the partitions are made of differing block sizes; for example, there may be two partitions, these two having block sizes corresponding to the typical compressed sizes of the blocks of data. These compressed sizes may be perhaps one-half and two-thirds the size of the original data blocks in a typical situation. Data which cannot be compressed to the two-thirds value or less is either stored in other storage (e.g., the hard disk) or preferably is stored in a third partition of the memory device with block size of the original (uncompressed) data. The storage arrangement may preferably use a semiconductor RAM array, or it may use a combination of RAM and disk as described in the application Ser. No. 627,722.

In one embodiment, a data storage device, such as a bank of DRAMs, is employed for storing all page-swap data for a virtual memory management system. The semiconductor memory is partitioned into three parts, two of these for compressed pages and one for the small percentage of page that will not compress to a given size. The two fixed-size compressed block partitions are formatted for two different compressed block sizes equal to what a compressed version of the original block size will fit into for the majority of cases. One of these partitions is for blocks 50% of the original size, and the other for 70% of original, in one example. The relative number of blocks in each partition (e.g., the physical storage capacity of each partition) is set at the average ratio of compressible blocks to uncompressible blocks for the compression algorithm used. By compressible it is meant that the block of data can be compressed to the block size of one of the compressed block partitions, and by uncompressible it is meant that the block will not compress to the required block size to fit in the compressed block partition. It is reasonable to select an algorithm that will compress 90% of the blocks to either 50% or 70% of their original size, so in this case a ratio of the number of blocks in the compressed partitions to the number of blocks in the uncompressed partition is selected as 90:10. The size of the blocks is selected to be some efficient value depending upon the system and the way data is handled in the system; for example, the block size is probably best selected to be the page size of 4 Kbytes, or a submultiple of the page size. Although the page size is typically 2K-bytes or 4K-bytes in the most commonly-used operating systems, other sizes may be appropriate. In the example embodiment, the block size of uncompressed data is selected to be 4 Kbytes (actually 4096-bytes), while compression to 50% would mean one of the compressed data block size is 2 Kbytes (2048-bytes) and compression to 70% would mean the other block size is about 2.8-Kbytes. A hit rate of approximately 90% may be achieved with this partitioning. The 10% of pages found not compressible to the 70% size are stored uncompressed in the third partition of the DRAM memory.

In one embodiment, a method is provided for collecting statistics on the page data being handled, and adapts the partitions to optimize capacity based on the kind of data encountered. Thus, the partitioning is adaptive, changing according to the compressibility of the page data.

In an alternative embodiment, instead of using the third partition of the DRAM memory, the ordinary storage device, such as a hard disk, is employed for pages that cannot be compressed to the threshold 70% size. The disk storage is used as uncompressed storage, functioning as a partition made up of addressable locations of a block size equal to that of the original uncompressed data (e.g., page size of 4 KB).

In operation of the preferred embodiment, the computer system sends (writes) data in blocks (pages) to the storage device, and before being written the data blocks pass through a compression unit which attempts to compress the blocks using the algorithm of choice. A counter keeps track of how many bytes of physical storage are required to store the compressed data. If the number exceeds the size of the blocks used for physical data storage in the larger of the two compressed data partitions, then the actual amount of storage required (value in the counter) is returned to the operating system, which resends the page to the correct partition, so the data block is written uncompressed in the other partition and the addressing information maintained by the operating system reflects this. But if the block is compressed to the number of bytes of the smallest compressed partition then the data is stored in this compressed partition, or if compressed to the size of the larger compressed data partition it is stored thus, and in either event the location is recorded as such by driver software (added to the operating system). The driver records the values in the operating system kernel data structures which map the page-swap device translations. Upon recall, a request from the computer for a given page is checked against these stored addresses, and retrieved from the partition where it is found, then, if necessary, decompressed before sending to the computer. The average performance of the page swapping operation is greatly enhanced, the pages are stored in much faster semiconductor memory.

The performance of the page-swap memory unit as described will depend upon the speed of the compression and decompression mechanism. If the data compression requires too long, then the speed advantage of semiconductor RAMs over hard disk is lost. Therefore, in one embodiment, a compression arrangement is employed which operates upon one to four byte segments of data and performs a single-clock compression of this data if a match is found. In particular, Lempel-Ziv compression circuitry is employed which performs comparisons of all match sizes of a lookahead buffer to all positions in a window, for single-clock compression of all matches (one to four bytes). A tuned Lempel-Ziv algorithm uses 8-bit symbols, with a 64-symbol window, and a four-symbol lookahead buffer. This algorithm produces output values that are the same bit-width (9-bits) for either match or no-match to greatly simplify the task of bit-packing the compressed output. The DRAM storage for compressed data is arranged in a bitwidth (36-bits) that is a multiple of the compressed data size (9-bits) to simplify the task of circuitry which bit-packs the compressed output. This compression mechanism is pipelined so that one byte is passed every clock cycle.

An important feature is the use of ECC (error correcting code) to maintain data integrity, even though DRAMs with potentially high soft error rates are employed. That is, the DRAMs may have soft error rates which are not acceptable for use in main memory, and may indeed be slower than ordinarily used for DRAM storage and have other relaxed specifications; these devices are referred to as "audio grade" DRAMs by some in the industry. The data being stored in the memory unit (whether compressed or uncompressed) passes through an ECC generator circuit to produce a code that is stored with each block of bytes, then upon recall the ECC circuit checks the code and makes a correction if a recoverable error is detected. The ECC logic uses a code with a 9-bit character size to effectively correct errors on the 9-bit compressed data.

Another feature of the invention is the use of high-performance standard interface to the system bus. A FIFO is included to buffer write data coming into the compression unit or read data going from the compression unit to the system bus, and when a bus grant is received a burst of data is sent instead of just one word. In the interface between the memory controller and the DRAM memory, a 2-word buffer is employed so that a page-mode read or write can be implemented if two words are waiting to be accessed.

BRIEF DESCRIPTION OF THE DRAWINGS

The novel features believed characteristic of the invention are set forth in the appended claims. The invention itself, however, as well as other features and advantages thereof, will be best understood by reference to the detailed description of specific embodiments which follows, when read in conjunction with the accompanying drawing, wherein:

FIG. 4 is a diagram of the contents of the lookahead buffer and window buffer in the circuit of FIG. 3 for an example of a data input;

FIG. 19 is a diagram of the mapping of memory 17 in accordance with a dynamic allocation method, according to one embodiment; and FIG. 20 is another diagram of mapping the memory 17 in accordance with the dynamic allocation method.

DETAILED DESCRIPTION OF SPECIFIC EMBODIMENTS

Figure 1:
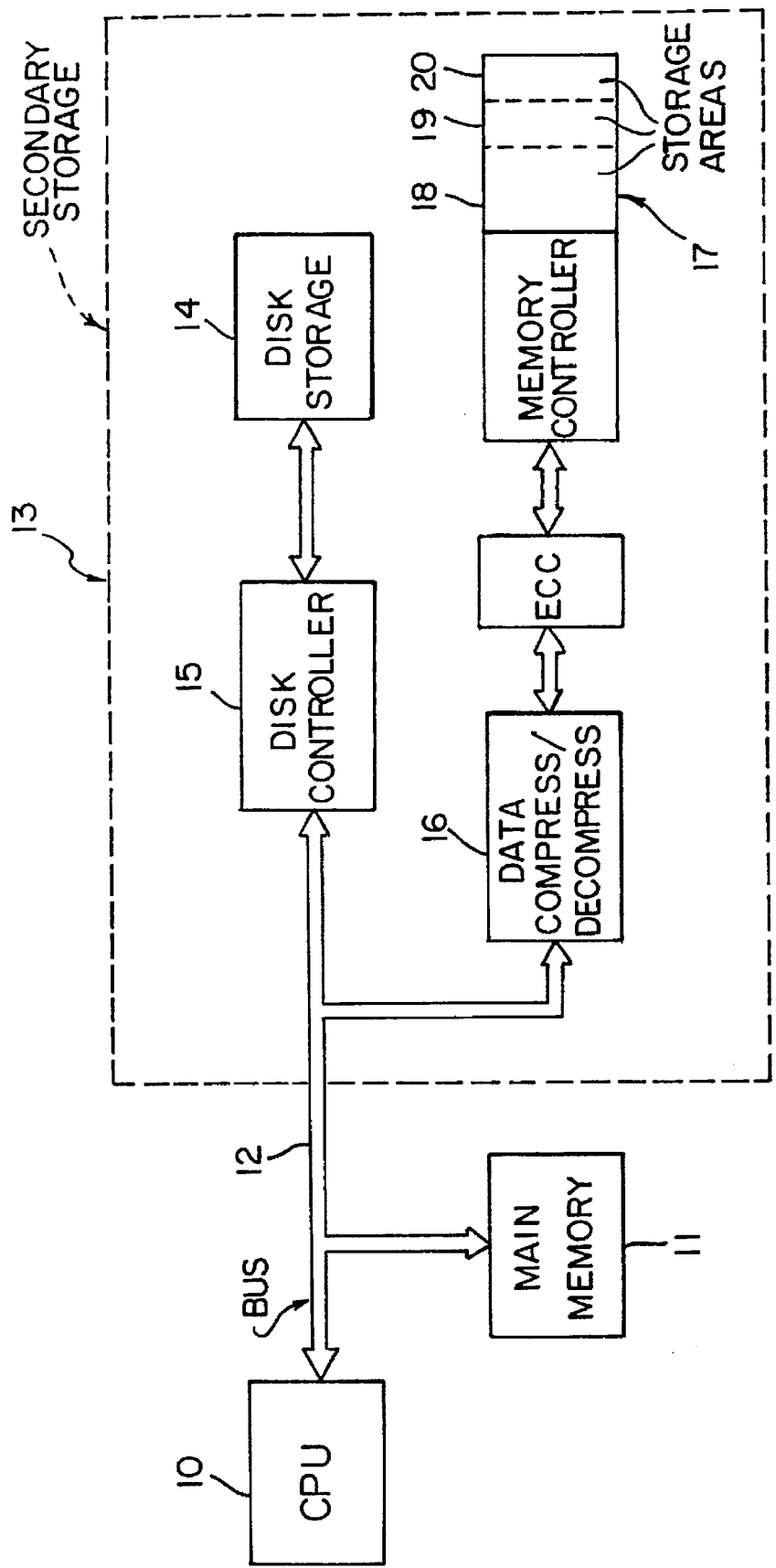
FIG. 1 is an electrical diagram in block form of a digital system including a memory for storing pages of data, using features of one embodiment of the invention.

Referring to FIG. 1, a data compression method according to the invention is used in a system having a source 10 of data to be stored and recalled, and in a typical application this source would be a CPU or the like, although various other data sources may use the features herein disclosed. In particular, the data source 10 is the CPU of a workstation or the like, using a virtual memory management scheme such as the UNIX operating system handling fixed-size pages of data (e.g., each page is 4 Kbyte). The CPU 10 employs a main memory 11 coupled to the CPU by a system bus 12, and secondary storage 13 is also coupled to the CPU by the bus 12. When the CPU 10 has a unit of data to store it is sent by the bus 12 along with appropriate addresses and controls in the usual manner of operating a CPU with main memory and disk storage or the like. When the unit is a page to be swapped, however, as when the CPU 10 is executing an operating system using virtual memory, the page is written to a swap space in secondary storage 13 (this secondary storage constructed according to the invention taking the place of what is usually simply a hard disk in conventional systems). The secondary storage includes a disk 14 operated by a disk controller 15 for storing files in the usual manner (and also for storing uncompressed fixed-size page data in an alternative embodiment). In addition, a swap space or swap partition is provided, as is usual for UNIX virtual memory management, and according to a preferred embodiment this swap space uses a data compression unit 16 along with a DRAM memory 17 for storing compressed pages. The data compression mechanism 16 examines each page of data received from the CPU 10 during a page-swap operation and determines whether or not compression is possible for this page. If compression is elected, the compression mechanism 16 sends the compressed page of data to the memory 17. The memory 17 contains three storage areas 18, 19 and 20 for two fixed sizes of compressed page-oriented storage and one size of uncompressed storage. The area 18 is of a size for 50% compression and the area 19 for 70% compression, while the area 20 is for uncompressed pages. If a page can be compressed to 70% or less of its original 4 Kbyte size in the compression unit 16, then the compressed page of data is sent to the memory 17 to be stored in the area 18 or area 19, depending upon the degree of compression. On the other hand, if compression to 70% or less is not possible, the page is stored in the uncompressed area 20 in a preferred embodiment; alternatively, a partition in the disk 14 reserved for page swapping, i.e., for virtual memory management, may be used for these uncompressed pages. The operating system maintains a table indexed by virtual page address giving the location of each page, i.e., whether it is present in memory 11, or, if not, which partition in swap space it is located in.

In the example embodiment, using 4 Kbyte page size, and employing 32-bit (4-byte) word width and data bus width in the bus 12, a page is transferred on the bus 12 as a 1 K-word block of data, using a page address (low-order 12-bits of byte address is all zeros). If compressed to 50%, this 1 Kword block would be stored in the memory partition 18 in approximately a 512-word block (the bits added by the ECC circuitry would add to the size). If compressed to 70%, the 1 Kword block would be stored in the memory partition 19 in about a 700-word block. If not compressible, it is stored in partition 20 as a 1024-word block (plus ECC increment added). The ratio of sizes of the partitions 18, 19 and 20 may be selected based upon historical empirical data of the compressibility of the data for the particular code and data in the task being executed. Or, the partitioning may be dynamically altered depending upon the actual compressibility of the currently executing task. In either event, the partition 20 is of a size needed to store only about 10% of the pages.

The operating system executed by the computer 10 maintains a table in memory 11 of the locations of pages. As each page is stored in the memory 17, its location is returned to the operating system. Or, if a page is present in physical memory, this is indicated in the page tables. When a memory reference is made by the CPU to data in a page not present in physical memory, then a page fault is executed, resulting in a page swap. Various algorithms may be used to decide which page to swap out to make room for the needed page in physical memory. An alternative way of operating the page swap mechanism of the invention is to mark the uncompressible pages to be always present in physical memory, rather than storing them in the partition 20, in which case there is no need for the partition 20.

In another alternative embodiment, if the hard disk 14 were used for uncompressed storage, the mapping of page location could be maintained by the secondary storage itself, rather than by the operating system. In this case, for recall of page data stored in the memory 17, the system of FIG. 1 would send a page address (plus controls), and if the disk controller found this address in a table maintained of pages on disk then a disk read would be implemented and the page returned to the CPU for writing to main memory 11. The controller for the memory 17 would also search for the page address in a table maintained locally to determine if the page was stored in the partitions 18 or 19 as compressed data, and if so the page would be read from the indicated location in partition 18 or 19 and uncompressed before returning the page to the CPU via bus 12 in an uncompressed state. Of course, the page would be found in either the disk 14 or the memory 17, but not both. The CPU 10 would merely send out an address on the bus 12 (e.g., the virtual memory address) to recall a given page, and would not itself need to keep track of whether the page was stored compressed, nor which partition was used to store a given page.

Figure 2B:
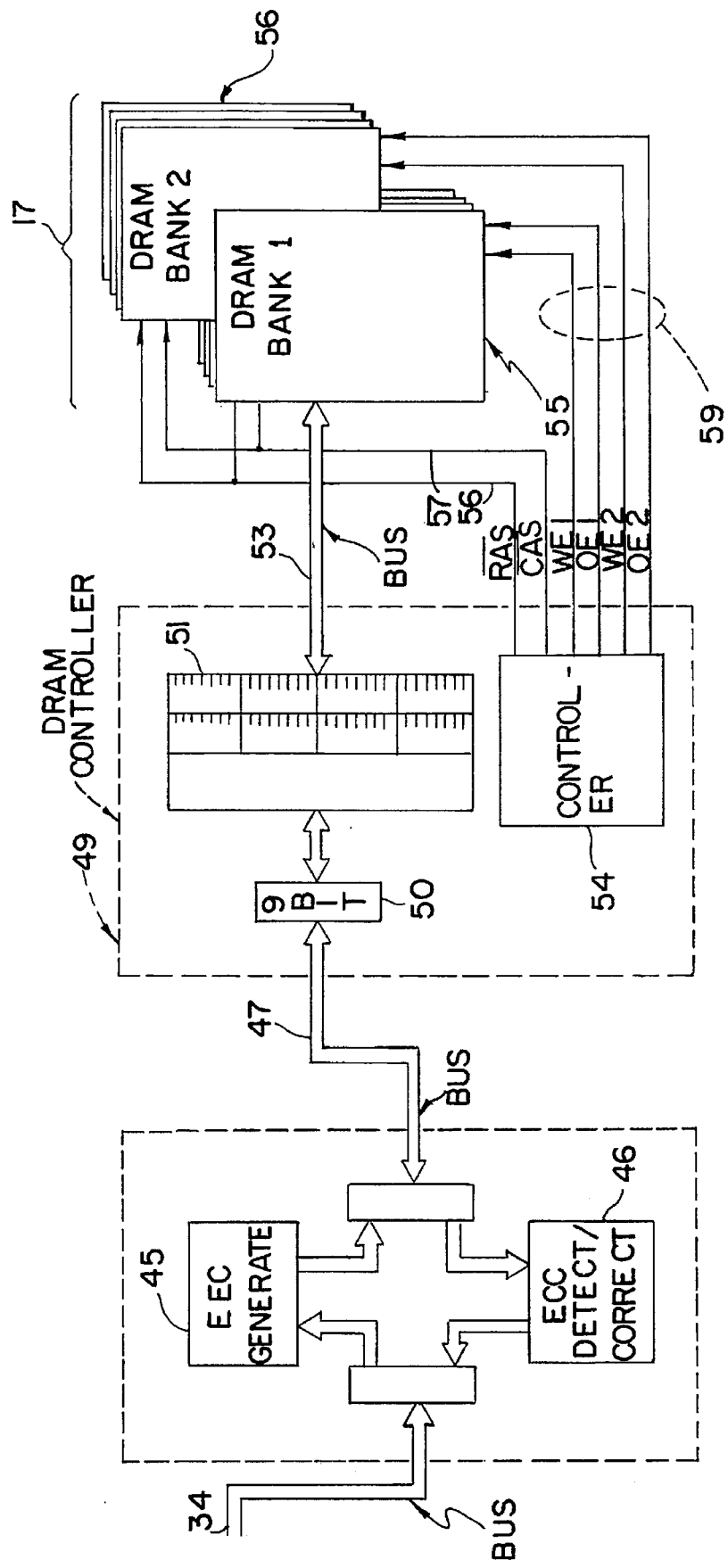
FIG. 2 a more detailed electrical diagram in block form of a data compression unit and ECC unit used in the system of FIG. 1.

With reference to FIG. 2, one example of the construction of the data compression mechanism 16 and its memory controller of FIG. 1 using the features of the invention is illustrated. The compression mechanism receives data from the CPU 10 by the bus 12 which typically would include an address bus 12a, a data bus 12b and a control bus 12c, all being input to a bus interface unit 22. The interface unit 22 provides an interface so that four-word bursts of data may be transferred from the system bus into or out of the mechanism 16, thereby increasing the overall transfer rate. A first-In-first-Out (FIFO) 23 buffers incoming and outgoing data to or from the bus 12. The FIFO 23 is four words deep, i.e, has a data width of 32-bits (one word) and is four bits deep for every bit position. A burst-sensing arrangement in the interface controller 24 generates a Bus-Request for control bus 12c whenever at least one word is in the four-word FIFO 23 ready to transfer to the bus 12; when the CPU responds with a Bus-Grant on control bus 12c, the FIFO is checked to see how many words are ready for transfer, and produces a burst of that many words (up to four) onto the bus 12. If only one word is ready, then of course only one word will be transferred. Similarly, up to four words can be accepted in a transfer from the CPU 10 to the unit 11 via the bus 12; depending upon how many words are in the FIFO (not yet processed) and how many words the CPU has ready to send, up to four words can be transferred in a burst, under control of the controller 24. After transfer into the FIFO 23, the data is fed one byte at a time to a compression mechanism 26 via bus 27, using an 8-bit output buffer 28. The buffer 28 is loaded from the FIFO by a 1-of-4 selector 29 which selects one of the four bytes of a word, and by a 1-of-4 selector 30 which selects one of four words in each four-deep bit position 31. A counter 32 operated by a clock 33 (e.g., the system clock for the CPU 10) controls the selectors 29 and 32. This same clock controlling the compression mechanism 26 and other parts of the mechanism 16, as well. The controller 24 may respond to commands on the bus 12 in a manner similar to a disk controller, i.e, the CPU 10 sends commands and data by writing to registers in the bus interface controller 24 using the buses 12a, 12b and 12c in the I/O space of the CPU. The CPU 10 may send a page to be stored in a format including commands on control bus 12c, an address field on address bus 12a, and a 4 Kbyte data field in bursts of four 4-byte words. An important feature of the construction of the FIFO 23 is that it uses shift register cells instead of flip-flop (static) cells or a RAM array, which allows the FIFO to be implemented in a much smaller number of gates in a gate array.

Data to be stored, received from the CPU 10 via FIFO 23, is directed by the 8-bit bus 27 to the data compression mechanism 26, one byte each clock cycle. The data compression mechanism 26 may be of various types of construction, and serves to accept fixed-length segments of data from bus 27, one byte at a time, and to ultimately produce variable-length pages of output data on output bus 34. The compression method used is preferably a unique implementation of the so-called Lempel-Ziv type as described by Ziv, J. and Lempel, A., "Compression of individual sequences via variable-rate coding", IEEE Trans. on Information Theory, September 1978, pp. 530–536, or other improvements may be used such as described by Terry A. Welsh, "A technique for high-performance data compression", IEEE Computer, June 1984. The mechanism 26 may be a processor itself, executing code, or may be a sequential state machine, or preferably a logic network constructed of gate arrays. The amount of compression of a given page of data will depend upon the degree of repetitiveness of patterns of characters in the page, since the compression technique is based upon the concept of substituting a shorter code symbol in place of a sequence of bytes which has appeared before in the page. In the improved implementation, a window is examined in a 64×8-bit register 35 using a 4×8-bit lookahead buffer 36, and the one-clock compare logic 37 produces a match output 38, a match address output 39 and a match length output 40, in one clock cycle. This compression mechanism operates upon one to four byte segments of data and performs a single-clock compression of this data if a match is found. The Lempel-Ziv compression circuitry employed performs comparisons of all match sizes of the lookahead buffer 36 of all positions in the window 35, for single-clock compression of all matches (one to four bytes). A tuned Lempel-Ziv algorithm uses 8-bit symbols, with a 64-symbol window 35, and a four-symbol lookahead buffer 36. This algorithm produces output values on the bus 34, each clock cycle, that are the same bit-width (9-bits) for either match or no-match to greatly simplify the task of bit-packing the compressed output. This compression mechanism is pipelined so that one byte is passed every clock cycle.

The 9-bit data on bus 34 is applied to an ECC generate circuit 45, to produce an code that is stored with each block, then upon recall an ECC detect/correct circuit 46 checks the code and makes a correction if a recoverable error is detected. The ECC logic uses a code with a 9-bit character size to effectively correct errors on the 9-bit compressed data, one 9-bit byte at a time, as it comes in on the bus 34. A linear feedback shift register, with the 9-bit symbols in bit-parallel, receives the incoming data and generates the ECC code on the fly in the generator 45.

The DRAM controller 49 receives the 9-bit data from bus 47 into a 9-bit buffer 50, and loads this data into a word-wide two-word buffer 51 via a selector 52. The buffer 51 is 4×9-bits wide (one word) and two words deep, so there can be two 36-bit words ready to apply to the 36-bit wide memory bus 53 at any given time. The memory 17 is configured as two banks 55 and 56 of DRAM devices, preferably 4-Meg, 16-Meg or larger for each memory device. Note that the DRAM storage for compressed data is arranged in a bit-width (36-bits) that is a multiple of the compressed data size (9-bits) to simplify the task of circuitry which bit-packs the compressed output. If the depth of the partition 18 were 512-words, a DRAM having 2048 columns would fit four pages in one column width. Then, if the partition 19 was about 70% of a 1024-word page size, three pages would fit in a column. The object is to fill the DRAM with a minimum of unused memory area, for maximum economy. The two-word buffer 51 along with sensing logic in control circuitry 54 responsive to the content of the buffer provides a page-mode write, thereby decreasing the effective memory cycle time; when one word of data is ready to be written to the DRAMs, a write cycle is initiated and if a second word of data is in the buffer 51 ready to be written write operation is completed and if the second word is to be written to the same page, then the normal single-word write is changed to a page-mode write and both words written in one cycle. The controller 13 generates a single set of strobes on lines 57 and 58 for each two banks 55 and 56 of DRAMs, along with separate sets of write-enable and output-enable controls on lines 59 going to the two banks. This economizes on the number of output pins needed for the gate array used to construct the DRAM controller.

The operations in the system of FIG. 2 are pipelined, so in a single clock cycle a number of operations are taking place. In a compression operation, a data byte is transferred from the FIFO 23 into the lookahead buffer 36 via buffer 28 and bus 27 in a clock cycle, so a new byte is added to the lookahead buffer in each clock. A comparison is made of a byte in the lookahead buffer 36 with the 64-byte sliding window 35 and a match indication or symbol vector, or non-match character, is generated in each clock cycle. A symbol vector or non-match character is presented to the ECC circuit via bus 34 in a clock cycle (some cycles are skipped when a match is pending), and a 9-bit ECC symbol is presented to the buffer 50 via bus 47 in a clock cycle. A 36-bit word is available in the buffer 51 every four clock cycles for storage in the slow DRAM memory 17. In a decompression operation, a 36-bit word (multiple ECC-based symbol vectors and/or characters) is transferred from the slow DRAM 17 to the buffer 51 so that a 9-bit symbol is available to the ECC circuit via buffer 50 and bus 47 in each clock cycle. The ECC detection is carried out in the detection/correction circuit 46 at the rate of one symbol per clock. In the decompress circuit 60, which uses the same lookahead buffer 36 and sliding window 35, a 9-bit symbol is converted or a non-match character is transferred to the sliding window in a clock cycle. And, data is transferred from the sliding window 35 to the FIFO at one byte per clock, to on average the transfer rate to the system bus (at four bytes per word) is one byte per clock or one word per four clocks.

Figure 3:
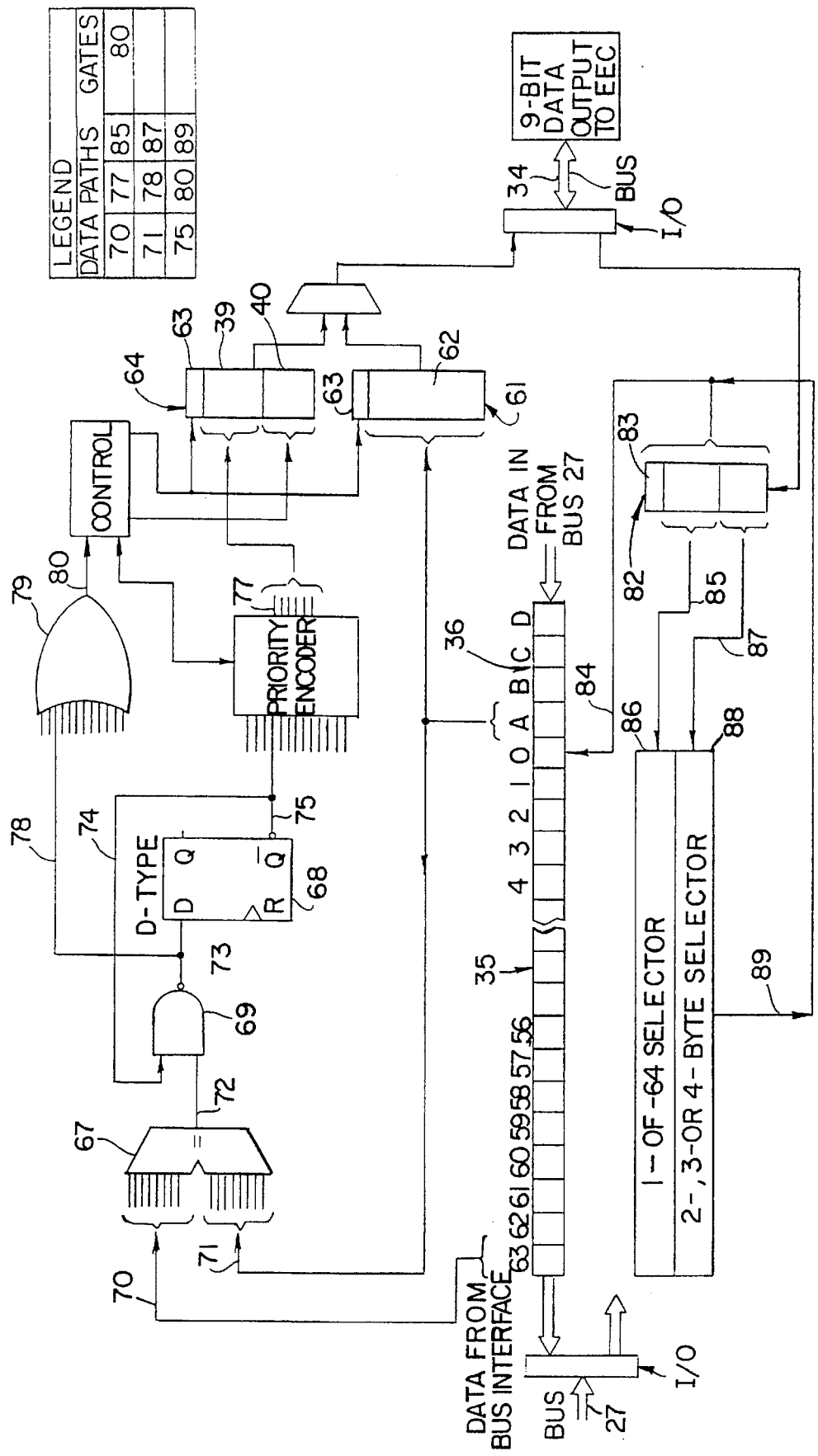
FIG. 3 is a more detailed electrical diagram of the compression and decompression circuits in the system of FIG. 2.

Referring to FIG. 3, the compression circuitry in the mechanism 16 includes a four-byte lookahead buffer 36 and a sixty-four byte window buffer 35, with the data from the buffer 28 being clocked into the right-hand end, one byte each clock cycle. The compare circuitry 37 checks to see if any two-byte, three-byte or four-byte sequence in the window 35 is the same as what is in the lookahead buffer 36, and, if so, substitutes, the address (in the range 0–63) of the beginning of the sequence and the length (2-, 3- or 4-bytes) of the sequence, in place of the data itself, as the address 39 and the length 40. Thus, a 9-bit output data value is sent to the ECC circuit from the compare circuit that is either (1) a value of the format 61 seen in FIG. 3 which has a field 62 which the same as the input data byte with a 9th bit in field 63 that indicates no-match, or (2) a value of the format 64 which includes a 6-bit address field 39 and a 2-bit length field 40 indicating how many bytes are matched, along with a 9th bit in field 63 that indicates "match data". In a clock cycle, the byte in position A of the lookahead buffer 36 is compared with all 64-bytes of data in the window 35 (bytes 0–63) by a set of sixty-four compare circuits 67, one for each position of the window 35. If no compare is found in any of the sixty-four compare operations performed, the original character is sent out as the 9-bit format 61, the data shifts one position to the left in window 35 and buffer 36, a new byte enters at position D of the lookahead buffer 36, and another 64-position compare is made of the byte now in position A. If a compare is found, a hold is set in a flip-flop 68 for this position (0–63) of the window 35, and a left shift is executed and a new byte of data enters the right-hand position D of the lookahead buffer. Another byte is now in the position A (the byte that was previously in position B) and another compare is made by the sixty-four compare circuits 67. If another compare is found, this means that there are two adjacent bytes that are identical to two adjacent bytes in the window. The "hold" condition previously set in the flip-flop 68 is held, using the NAND gate 69, as will be explained, and another left shift is executed in the next clock, with another new byte entering position D. Another compare is performed by the sixty-four circuits 67, and this continues up to four compares. That is, the maximum number of identical bytes to be found is four, and these four are replaced with one 9-bit value of format 64 in the data stream sent to the ECC circuit via bus 34. So, if a 4 Kbyte page of 8-bit data was sent to the compression circuit 26 composed of all identical values (e.g., all zeros) the maximum compression produces 1024 9-bit characters or symbols of format 64, or to 28% of the original. During clocks where a match has been found, the output on bus 34 is a null or no-op, so there are gaps of one, two or three clock cycles when no output value is placed on the bus 34 from the compression circuit.

Each one of compare circuits 67 has two 8-bit inputs 70 and 71, with the input 70 being the contents of one of the window 35 positions (bytes 0–63), and the other input 71 being the contents of the position A of the lookahead buffer 36. If the contents are identical, an equality indication is produced at an output 72. This output is applied to the NAND gate 69, and the output 73 of the gate is applied to the flip-flop 67. The flip-flop is initialized to a "match" state after each data value is outputted to bus 34, so the feedback via line 74 from output 75 allows the NAND gate 69 to pass the match output 72 is it is high, indicating a match for the present compare. So, on the first clock, the byte compare is NANDed with the flip-flop output 75 to indicate if there is another match, and, if so, that state is latched (maintained) in the flip-flop by the input 73. All of the sixty-four flip-flops 68 at positions where there is no match will be switched to the "off" condition, so they will no longer be in contention for a multiple-byte match. After four clocks, only the flip-flops 68 of the sixty-four that have registered four matches in a row will still be "on". The sixty-four flip-flop outputs 75 go to a priority encoder 76 to generate on lines 77 the 6-bit address 39 of the lowest-number first byte of a four-byte match, i.e., the match closest to the lookahead buffer 36. After the match address is sent out as a format 64 match symbol, all flip-flips 68 are initialized to the starting state for a new compress cycle. If, after only three bytes have matched, the fourth byte shows no more matches, the current outputs of the flip-flops are immediately sent to the priority encoder 76 to generate the address of the 3-byte match. Similarly for 2-byte matches. A line 78 connects the output 73 of each of the sixty-four NAND gate 69 to a 64-input OR gate 79 to produce an output 80 to indicate there is a match somewhere in the window 65; so long as the output 80 is high, a new compare cycle is not started. The number of cycles that the output 80 stays high is used to generate the length field 40 of 2-, 3- or 4-bytes.

Instead of the compare circuit shown, where only one of the bytes of the lookahead buffer 35 is compared to the window 35 each cycle, the entire four bytes of the lookahead buffer can be compared in a single "gang compare" cycle. In such a case, if a four-byte compare was detected, the symbol 63 would be sent out as described above, then there would be three no-op cycles where no compare is done while new data is shifted into the lookahead buffer. The one-byte at a time compare as described above requires up to 75% fewer gates in a gate array for implementation, however, and still maintains the throughput speed of one clock per byte input. Also, the number of bytes in the lookahead buffer 36 could be increased, but this would require a larger format 61, 64 for the output symbols. If the number was eight, the field 40 would be 3-bits, for example. Likewise, an increase in the number of bytes in the window 35 is possible, and again would require an increase in the number of bits in the address field 39.

An example of a compression sequence using the circuit of FIG. 3 is illustrated in FIG. 4. The input string in the example is the text "THIS_IS_TEST_A_THIS_IS_TEST_$_B_$ ... " No match is found until after the fifth clock cycle, then a 3-bit match is found for "_IS" at address "02" which is clocked out on the eighth cycle. Then no match is found until clock sixteen where "_T" is matched at address "07" and clocked out at the seventeenth cycle. Four-byte matches are found to be clocked out at cycle-21, -25 and -29. In this example the number of input bytes is thirty-six, and the number of output symbols is twenty, providing a compression to 62.5% of original size.

The decompression operation uses the same 64-byte window buffer 35 as is used for compression. The 9-bit symbols from the bus 34 are loaded, one each clock cycle, to the buffer 82, and the ninth bit field 83 is used to determine whether the symbol is compressed or not. If not compressed the 8-bit field 62 which is the original character is loaded to byte-0 of the window 35 via lines 84. If compressed (field 83 a "1") the address field 39 is applied by path 85 to a 1-of-64 selector 86, while the number field 40 is applied via path 87 to a selector 88 which picks 2-, 3- or 4-bytes starting at the location selected by the selector 86, and feeds this value back to the byte-0 position via path 89 and lines 84, as the contents of window 35 are clocked to the left according to the number in field 66. Decompression thus proceeds at the clock rate, one byte per clock. The left-hand end of the window buffer 35 is applied to the bus 27, one byte per clock, and consists of the reconstructed original data.

Figure 5:
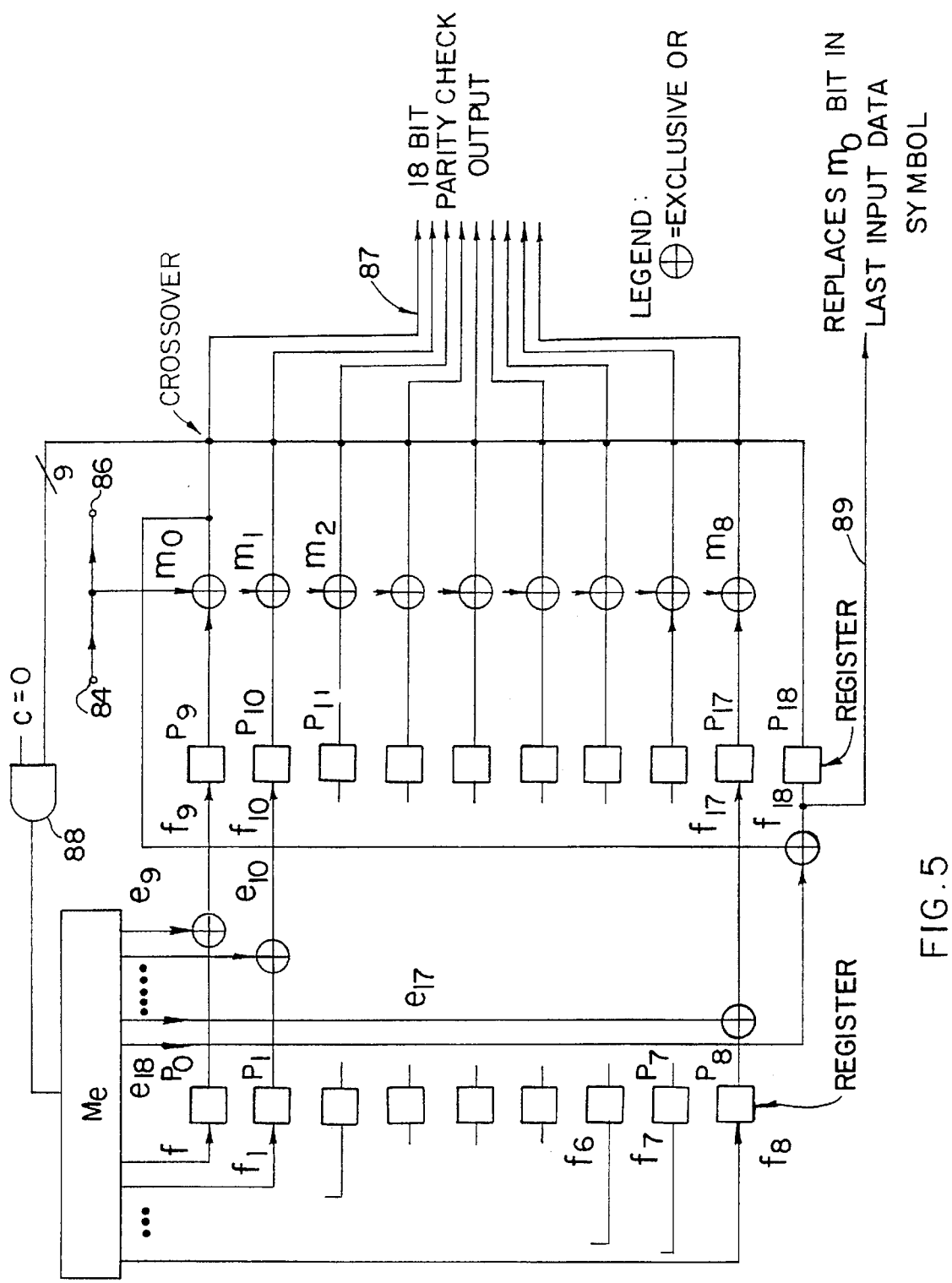
FIG. 5 is an electrical diagram of the ECC encoder circuit 45 of FIG. 2.
Figure 6:
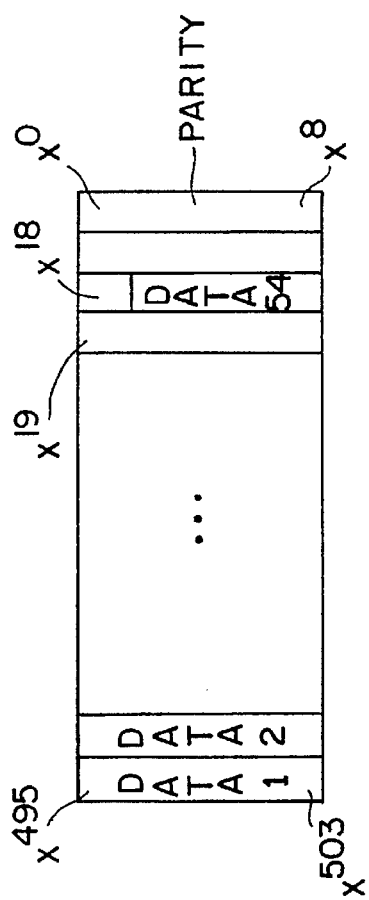
FIG. 6 is a diagram of the code word structure at the output of the ECC encoder circuit of FIG. 5.

Referring to FIG. 5, the ECC encoder circuitry 45 is illustrated. The input from the bus 34 is a series of 9-bit data words as generated by the compression circuit. The output to the bus 47 from the ECC encoder 45 is a sequence of fifty-six 9-bit data words as illustrated in FIG. 6. An input of 485 data bits (in 53 9-bit symbols plus 8-bits) has nineteen parity bits added to it to produce the output sequence of 56 9-bit words, a total of 504 bits, labelled $x^0$ to $x^{503}$ in FIG. 6. This is referred to as a (504, 485) code.

The generator polynomial used in the encoder of FIG. 5 is $$g(x)=m_0(x) \cdot m_1(x) \cdot m_3(x)$$

where $m_0(x)=x+1$ $m_1(x)=x^9+x^4+1$ $m_3(x)=x^9+x^6+x^4+x^3+1$

The polynomials are from Table C.2 of Peterson & Weldon, "Error-Correcting Codes", MIT Press (1972). Multiplying these polynomials gives $$g(x)=x^{19}+x^{18}+x^{16}+x^{15}+x^{13}+x^{12}+x^{11}+x^{10}+x^9+x^6+x^4+x^3+x+1$$

Encoding is performed by dividing the shifted message polynomial $x^{19}m(x)$ by $g(x)$ and appending the remainder $p(x)$ to $x^{19}m(x)$ to form a code word. That is, if $$\frac{x^{19}m(x)}{g(x)} = g(x) + \frac{p(x)}{g(x)}$$

Then $$c(x) = x^{19}m(x) + p(x)$$

Figure 7:
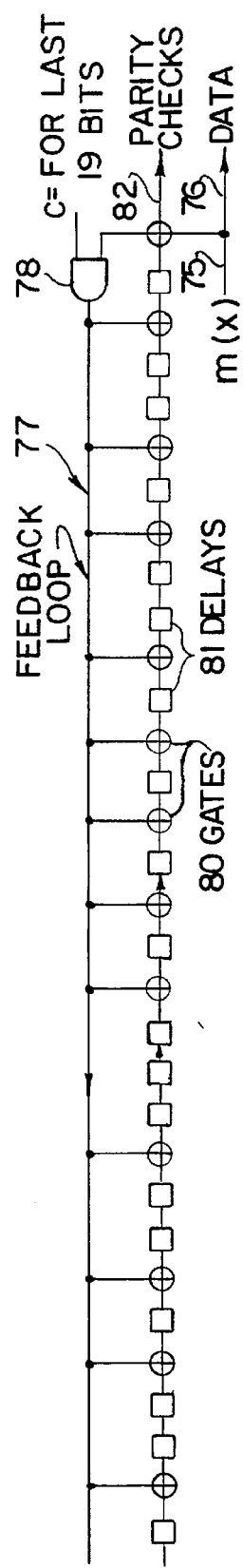
FIG. 7 is an electrical diagram of a bit serial encoder used for explaining the function of the circuit of FIG. 5.
Figure 8:
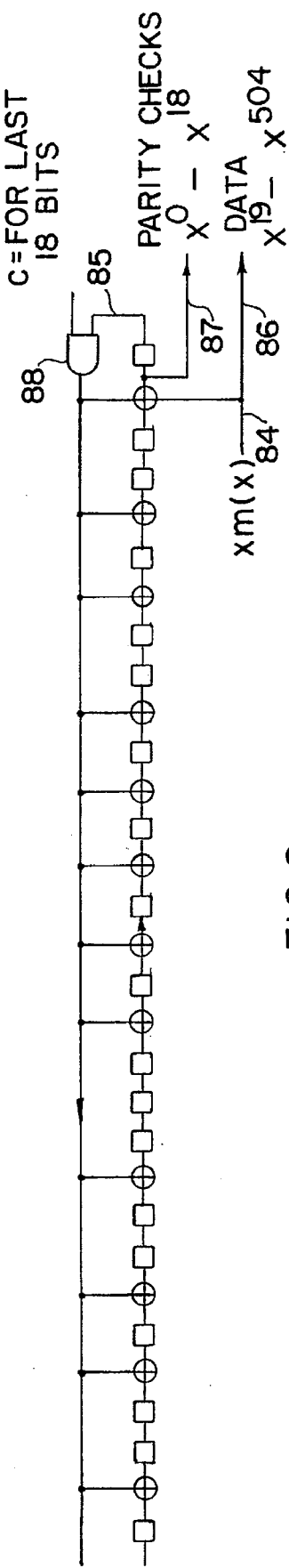
FIG. 8 is an electrical diagram of another bit serial encoder used for explaining the function of the circuit of FIG. 5.

Operation of the encoder circuit of FIG. 5, which functions in bit-parallel, is best explained by first referring to FIG. 7, where a conventional bit-serial feedback shift circuit is shown which would encode this (504, 485) code. This is an encoder for $g(x)$, using premultiplication by $x^{19}$. The serial input data $m(x)$ enters at input 75 and exits at output 76, and is also applied to the feedback loop 77 via gate 78, where the last 19-bits of a 504-bit series are masked by an input 79. The sequence of gates 80 and delays 81 results in an output of nineteen parity bits on line 82, following the 485-bit serial data on line 76. FIG. 8 shows a circuit which performs exactly the same function as the circuit of FIG. 7, but uses premultiplication by $x^{18}$. In operation the 485-bit message polynomial is shifted into this register at input 84 and path 85, and simultaneously shifted out to the channel at output 86, then the register is shifted once with a zero input. During this time the encoder outputs the high-order parity bit (in position $x^{18}$) at output 87. At this point the feedback connection via gate 88 is disabled and the last 18-bits of the parity check polynomial are shifted out via output 87.

FIG. 5 shows a circuit which performs the same function as the encoder of FIG. 8; it differs in that it inputs nine data bits at a time. In operation, the encoder circuit of FIG. 5 receives as input the 485 data bits with a single trailing zero, as fifty-four 9-tuples. After the last 9-bit symbol (which contains the trailing zero) is input the encoder contains the nineteen parity checks (to be bits $x_0$-$x^{19}$ of FIG. 5). The high-order parity check bit $x^{19}$ is then substituted for the trailing zero in the last data symbol and the remaining eighteen parity checks are outputted as two 9-tuples. The resulting code word, which consists of fifty-six 9-bit symbols, is depicted in FIG. 6.

The truth table of the circuit $M_e$ in FIG. 5 is given in Table 1. This table indicates which of the nine inputs $M_1+f_{10}$, $m_2+f_{11}, \ldots, m_8+f_{17}, f_{18}$ must be XORed to produce each of the nineteen outputs $f_0 f_1 \ldots f_{18}$. For example, the right-most column of the table shows that $$f_{18}=(m_1+p_{10})+(m_8+p_{17})$$

while the left-most column shows that $$f_0=(m_1+p_{10})+(m_2+p_{11})+(m_3+p_{12})+p_{18}$$

Because the code has nineteen parity check bits, the high-order parity check bit ($f_{18}$ in FIG. 6) must be inserted into the low-order position ($m_0$) of the last data symbol. Thus the encoder of FIG. 5 must be augmented by a 2:1, 1-wide, mux to implement this substitution.

Figure 9:
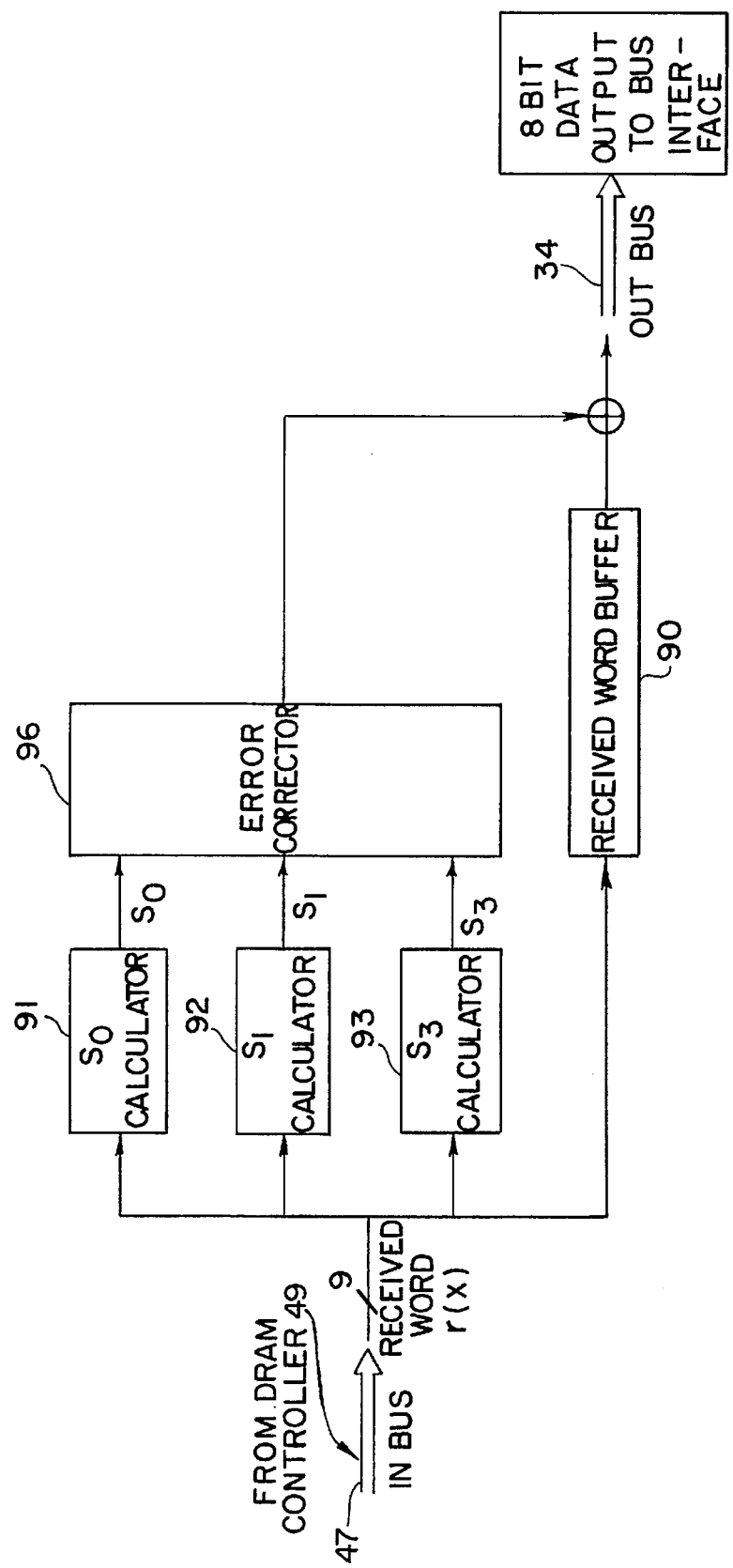
FIG. 9 is an electrical diagram of an ECC decoder circuit 46 used in the system of FIG. 2.

The ECC decoder 46 is illustrated in FIG. 9. This circuit receives the 9-bit words from the DRAM via bus 47 and produces a 9-bit wide output to bus 34, with fifty-six 9-bit input words producing an output of 53+8/9 9-bit words. The first step in decoding the received word r(x) is to compute three partial syndromes in the syndrome circuits 91, 92 and 93. These are $$S_0 = r(1) = e(1) = 0 \text{ if } 0, 2, 4, \ldots \text{errors}$$
$$= 1 \text{ if } 1, 3, 5, \ldots \text{errors}$$

$$S_1 = r(\alpha) = e(\alpha) = \sum_{i=1}^{v} x_i$$

$$S_3 = r(\alpha^3) = e(\alpha^3) = \sum_{i=1}^{v} x_i^3$$

Here the $x_i$ are the error locations and v denotes the number of errors. If v=0 then $S_0=S_1=S_3=0$. Note that $S_0$ is a 1-bit quantity while $S_1$ and $S_3$ are 9-bit elements of GF($2^9$).

In the event there is only one error, then $$S_0=1 \text{ and } S_1^3+S_3=0$$

In this case the location of the single error is given by $x_1=S_1$.

If two errors occur these partial syndromes are related to the coefficients of the error locator polynomial $$\Sigma(x)=(x+x_1)(x+x_2)=x^2+\sigma_1 x+\sigma_2$$

by the key equations $$S_0=0$$
$$S_1=\sigma_1$$
$$S_3=S_1^2\sigma_1+S_1\sigma_2$$

These equations can be solved to give $$\sigma_1 = S_1$$
$$\sigma_2 = \frac{S_3 + S_1^3}{S_1}$$

Factoring $\Sigma(x)$ gives its two roots $x_1$ and $x_2$. With $x_1$ and $x_2$ known, decoding is complete.

When three errors occur $$S_0=1 \ S_1^3+S_3 \neq 0$$

This combination of events can always be used to detect a three-error pattern. Some odd-weight patterns with five or more errors will also be detected in this way.

Figure 10:
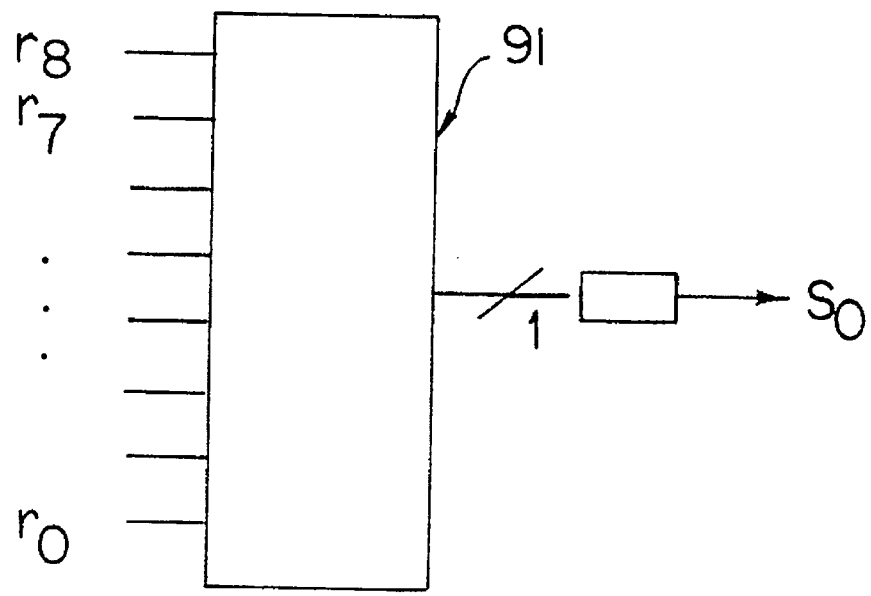
FIG. 10 is an electrical diagram of a circuit for computing a partial syndrome as used in the circuit of FIG. 9.
Figure 11:
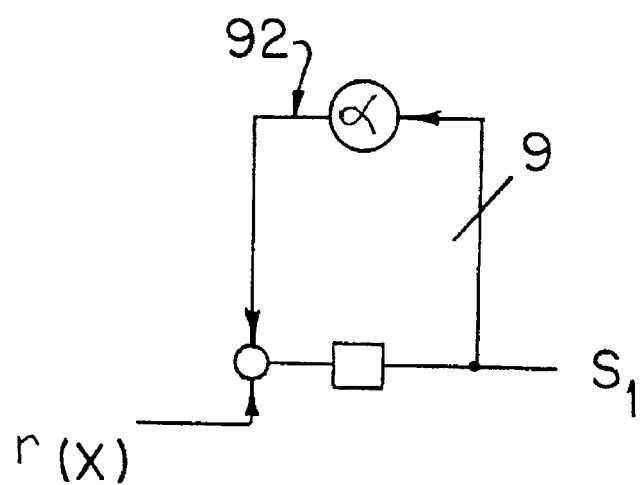
FIG. 11, is an electrical diagram of a bit-serial $S_1$-calculator used in the circuit of FIG. 9.

The ECC partial syndrome calculators are circuits for computing the three partial syndromes $S_0$, $S_1$, and $S_3$. FIG. 10 shows the $S_0$-calculator, which is a circuit that simply computes the sum (modulo 2) of all of the 504 bits of the received word. FIG. 11 shows a bit-serial circuit which computes $$S_1=r(\alpha)=r_0+r_1\alpha+r_2\alpha^2+\ldots r_{503}\alpha^{503}$$

Figure 12:
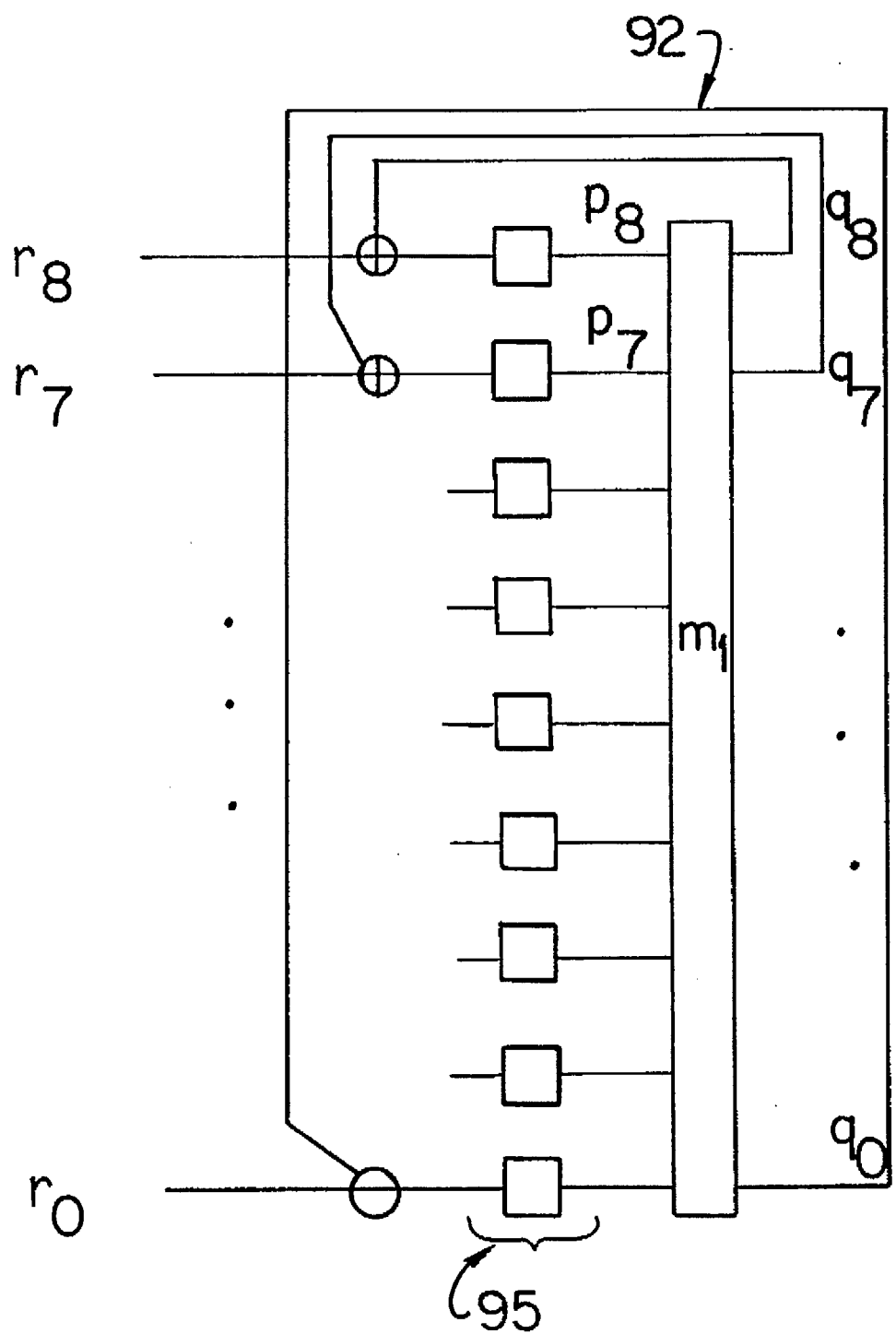
FIG. 12 is an electrical diagram of a symbol-wide $S_1$-calculator used in the circuit of FIG. 9.

FIG. 12 shows a symbol-wide circuit which performs the same function on nine bits $r_0$–$r_8$ as FIG. 11 does on one bit. The operation of this circuit will be explained and the function performed by the circuit $M_1$ defined.

Denoting the present state of the bit-serial circuit by $P=(P_8 \ P_7 \ P_6 \ \ldots \ P_0)=\alpha^P$, and inputing the polynomial $r(x)=r_8x^8+\ldots+r_0$, after nine shifts the register will contain $$\alpha^f = ((\alpha^P\alpha+r_8)\alpha+r_7)\alpha+r_6)\alpha+\ldots+r_0$$
$$= \alpha^{P+9}+r(\alpha)$$

Thus if $M_1$ in FIG. 12 is designed so that it multiplies its input by $\alpha^9$, this circuit will perform the same calculation as that of FIG. 10.

If the contents of the register are presented as $$p(x)=p_8x^8+p_7x^7+\ldots+p_0$$

then to multiply by $\alpha^9$ we must simply calculate $$\alpha^9 p(x)=p_8\alpha^{17}+p_7\alpha^{16}+\ldots+p_0\alpha^9$$

The truth table of an $\alpha^9$-multiplier is shown in Table 2.

Figure 13:
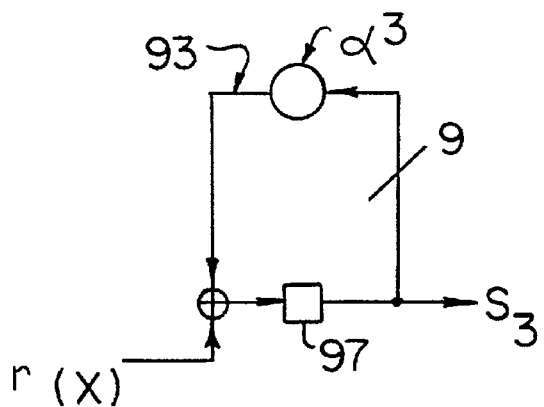
FIG. 13 is an electrical diagram of a bit-serial $S_3$-calculator used in the circuit of FIG. 9.

FIG. 13 shows a bit-serial circuit which computes $$S_3=r(\alpha^3)=r_0+r_1\alpha^3+r_2\alpha^6+\ldots+r_{503}\alpha^{1509}$$

If the present state of this circuit is denoted by $\alpha^P=(p_8, p_7, \ldots, p_0)$ then after nine shifts the register will contain $$\alpha^f = ((\alpha^P\alpha^3+r_8)\alpha^3+r_7)\alpha^3+\ldots+r_0$$
$$= \alpha^{P+27}+r(\alpha^3)$$

Figure 14:
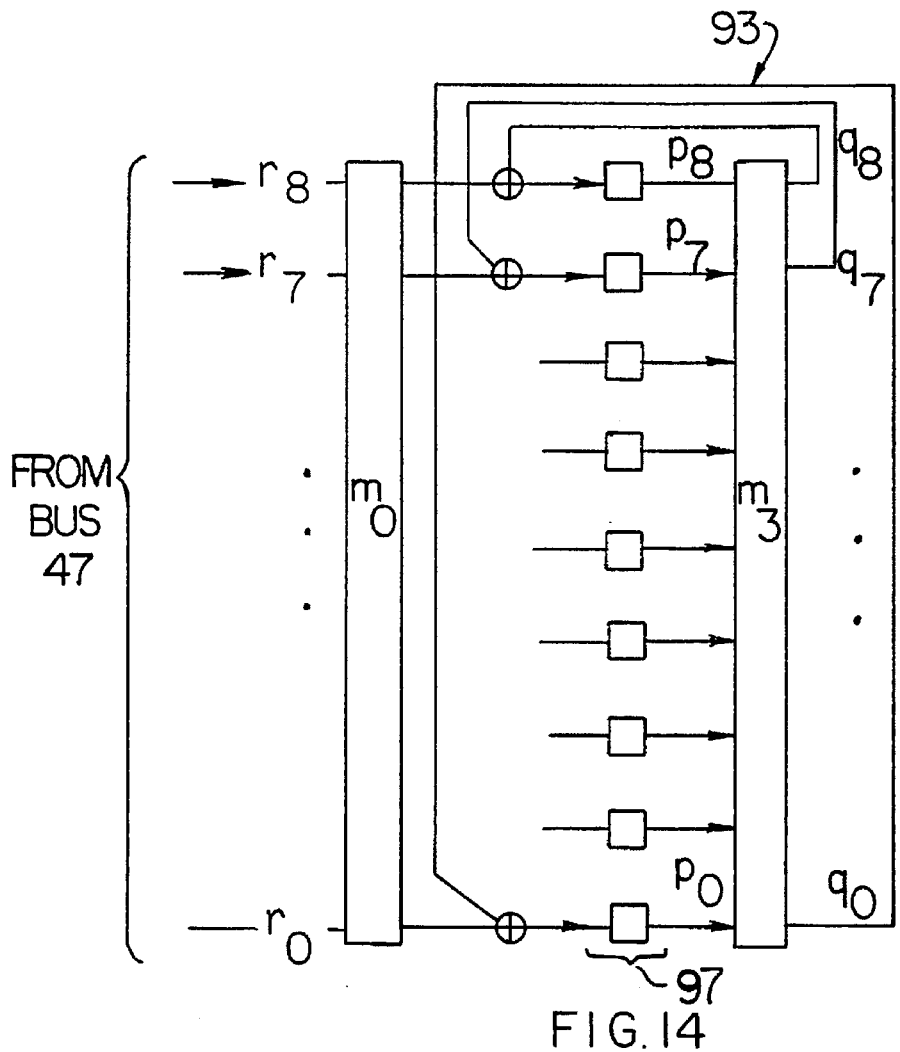
FIG. 14 is an electrical diagram of a symbol-wide $S_3$-calculator used in the circuit of FIG. 9.

FIG. 14 shows a symbol-wide circuit which performs the same function. Table 3a shows the truth table of the circuit $M_3$ (which multiples by $\alpha^{27}$), while Table 3b shows the corresponding table for the circuit $M_0$ (which evaluates r(x) at $\alpha^3$).

Figure 15:
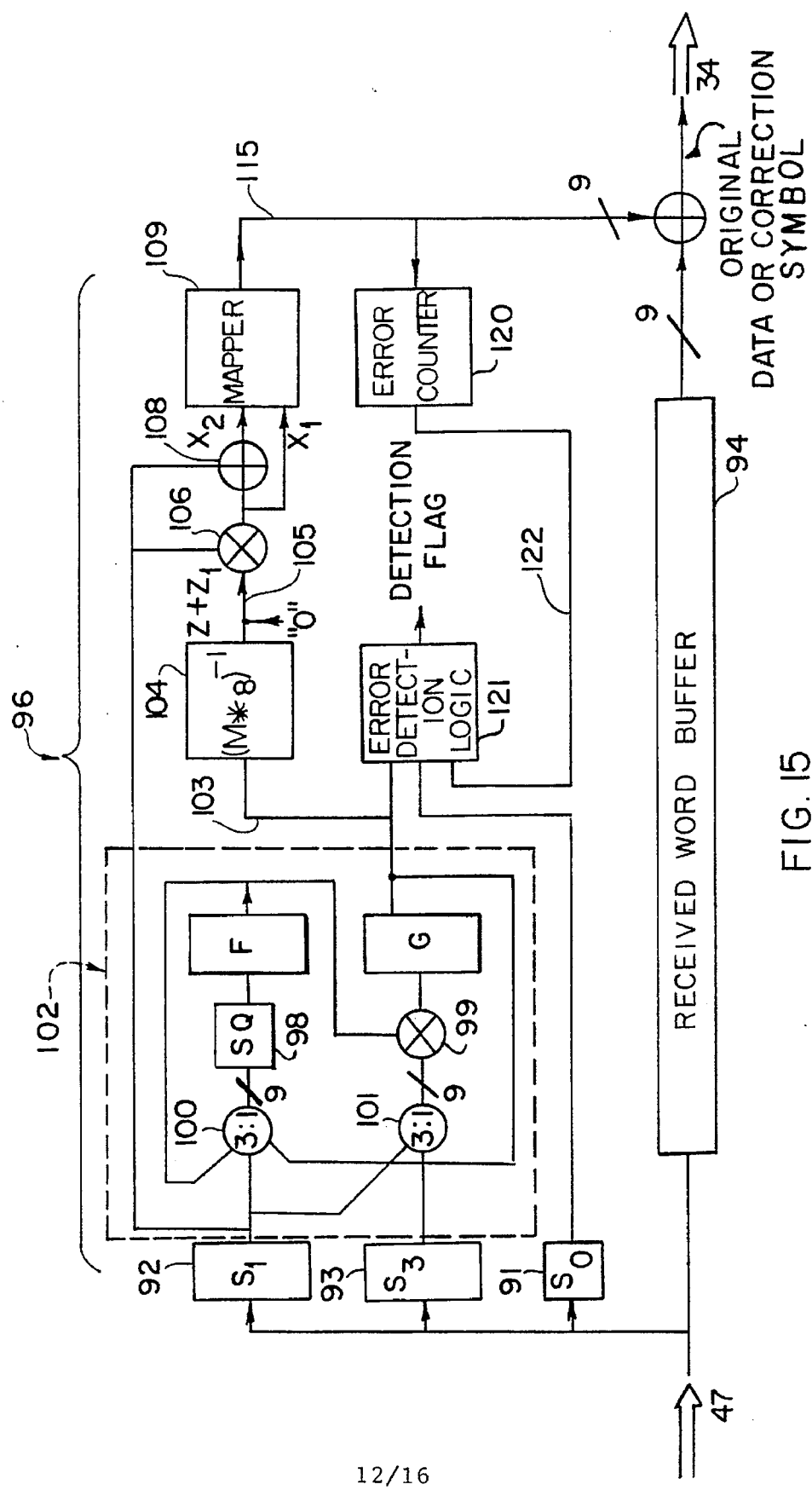
FIG. 15 is an electrical diagram of an ECC error corrector circuit used in the system of FIG. 9.

Referring to FIG. 15, the error corrector in the decoder of FIG. 9 is shown in more detail. The circuit performs the functions necessary for decoding as explained above. In operation, as the received word enters the decoder, the three partial syndromes are calculated in the circuits 91, 92 and 93. After the last 9-bit symbol enters, these syndromes are checked for all zeroes. If they are all zero, the data block is assumed to be correct and is outputted from the data buffer 94 to the bus 27. If any of the partial syndromes are non-zero, then the error-correction process explained below is executed. In this case, data flow is halted until correction is complete. The likelihood of an error is very small, probably not occurring more than once every few hours in typical operation, so the performance penalty is virtually zero.

The first step in the error correction process is the computation of $S_3/S_1^3$. Note that $$S_1^{-3}=S_1^{508}=((S_1^{127})^2)^2$$

and that $$S_1^{127}=S_1^1.S_1^2.S_1^4.S_1^8.S_1^{16}.S_1^{32}.S_1^{64}$$

Thus $S_1^{-3}$ can be calculated by an appropriate sequence of squarings and multiplications. Table 4 shows the sequence of steps involved in this calculation. After this is performed, $S_3$ is multiplied by $S_1^{508}$ and the result stored in Register G.

Adding 1 (i.e., inverting the lower-order bit) of this result gives the quantity $$A=1+S_3/S_1^3$$

used in factorization of the quadratic L(Z).

Here the 8-tuple A* is formed by deleting the lower-order bit of A and then multiplying A* by the matrix $(M_8^*)^{-1}$. The resulting 8-bit product, with a 0 appended in the lower-order position, is the quantity $Z_1$. Then $Z_1$ is multiplied by $\sigma_1(=S_1)$ to give the first error-location number $X_1$; next the second error-location number is calculated:

$$X_2 = X_1 + S_1$$

Figure 16:
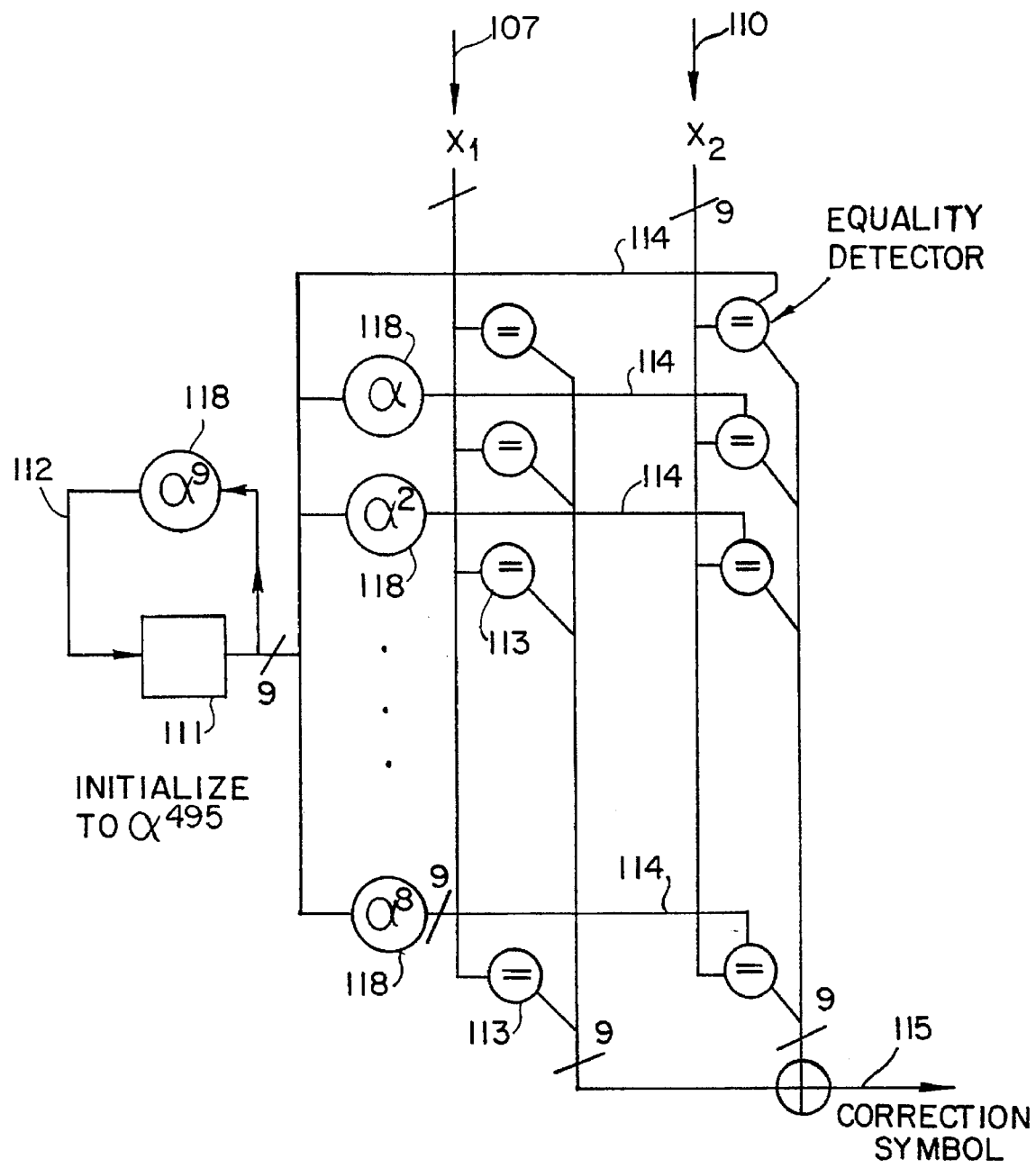
FIG. 16 is an electrical diagram of a mapper circuit used in the error corrector circuit of FIG. 15.
Figure 17:
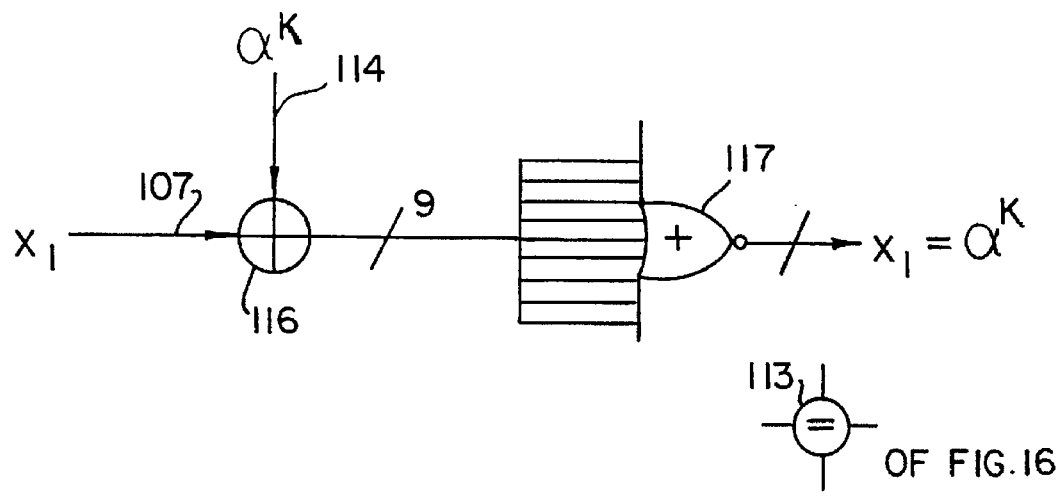
FIG. 17 is an electrical diagram of an equality detector circuit used in the circuit of FIG. 16.

At this point both error locations are fed to the Mapper, shown in detail in FIG. 16. Basically this circuit generates all possible error-location numbers from $\alpha^{503}$, to $\alpha^0$ in descending order. It computes these in sets of nine; first it computes $\alpha^{503}, \alpha^{502}, \ldots, \alpha^{495}$; then it computes $\alpha^{494}, \alpha^{493}, \alpha^{486}$, etc. At each step it compares $X_1$ and $X_2$ to these numbers and, if it finds a match, it outputs a 1 in the appropriate bit of the correction symbol. FIG. 17 shows a circuit which can be used for this comparison.

The process of computing the error location numbers $\alpha^{503}$, $\alpha^{502}$, etc., involves multiplication by various powers of $\alpha$, as shown in FIG. 16. Table 5 shows the matrices for the nine fixed-element multipliers used in FIG. 16.

This completes the correction process. It is necessary also to consider the task of detecting error patterns which are not correctable, i.e., error detection. In addition to correcting one or two bit errors per block, the code can detect all triple-error patterns and about three-quarters of higher weight patterns. Errors are detected in two ways:

Condition 1) Inconsistency between partial syndrome $S_0$ and number of errors corrected.

Condition 2) $A = 1 + (S_3/S_1^3)$ does not satisfy the constraint $a_0 = a_5$.

To check Condition 1 it is necessary to count the number of corrections made by the error corrector. The implementation of the error counter of FIG. 15 is straightforward and need not be explained. Basically the partial $S_0$ syndrome must be 0 if an even number of errors is corrected and 1 if an odd number. Table 6 lists the six possible combinations of $S_0$ and Error Count which can occur. The table shows that Condition 1 is easily detected with a single XOR-gate.

Figure 18:
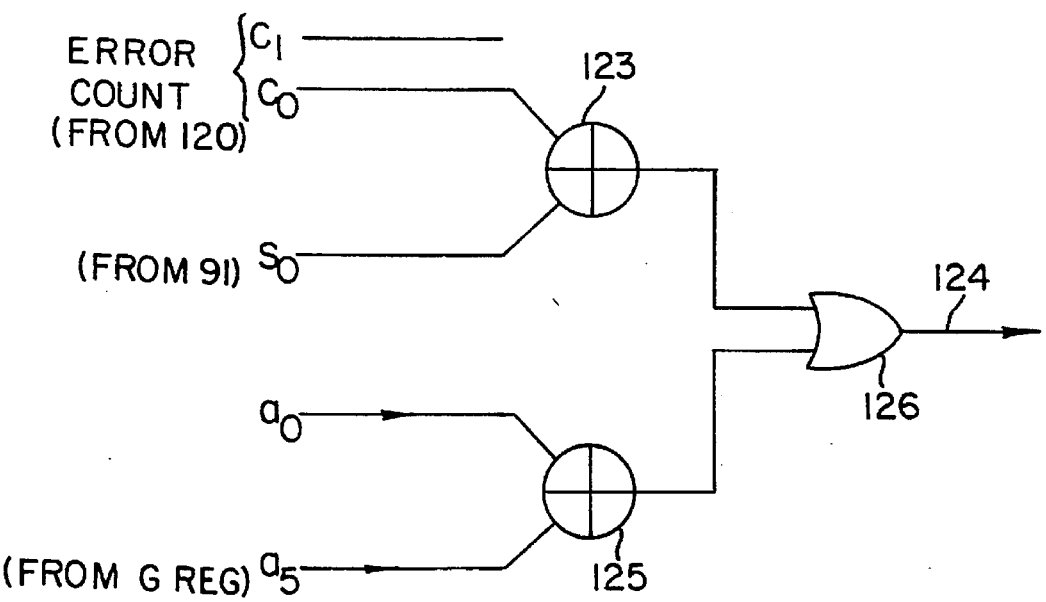
FIG. 18 is an electrical diagram of an error detection logic circuit used in the circuit of FIG. 16.

Checking Condition 2 is straightforward; if $a_0 = a_5$, an uncorrectable error has been detected. FIG. 18 shows a logic circuit which can be used to generate the Detection Flag in the Error Corrector of FIG. 15.

Another feature of one embodiment of the invention is the dynamic allocation of partitioning of the memory 17. The relative sizes of the partitions 18 and 19 in the memory 17 is chosen to fit the data being compressed. This may be done on an empirical basis, using the history of compressing page data for a particular task or application. According to another embodiment of the invention, the partition sizes can be calculated on a dynamic basis using the currently executing pages.

The logical size of a block of data handled by the system described above is a page, which is typically 4096 8-bit bytes. Usually the system addresses data in memory 11 by 8-bit bytes or 32-bit words. The compression system of FIG. 2, however, handles data in components to the right of the compression mechanism 26 in 9-bit bytes or 36-bit words. The memory 17 is purely a block addressable device, and, with data compression and ECC, handles 4096-byte pages (after compression and ECC bits added). The ECC logic maintains 56-bit words.

The maximum compression capability of the system of FIG. 2 is to replace four 8-bit data bytes on bus 27 with one 9-bit data byte on bus 34. The ECC circuit generates onto bus 53 a 56-byte block (FIG. 4) for each 53+(9-bit) bytes on bus 34. This ECC output is rounded to the next higher 56-bits. Thus, for a system page size of 4096 8-bit data bytes, the effective page size in 9-bit ECC bytes is (4096/4)*(56/53), rounded up to next 56=1120 (9-bit ECC bytes)

This is equivalent to twenty (i.e., 1120/56) ECC blocks. Since bits are added to the data being compressed and ECC parity bits are added, a page that is totally uncompressable would have one bit added to each byte in the compression mechanism 26 and expanded by a factor of 56/53 in the ECC generator 45 (plus round up), so 4869+ bytes theoretically would be produced for storing in the memory 17. The driver used to manage the system of FIG. 2 assures that only pages that compress to below certain thresholds will be stored in partitions 18 and 19, however. Those pages that expand are simply marked in error and not stored. Since system pages compress to various sizes, a method is provided to manage the data as variable length records.

Compression runs on typical data found in swap operations in a virtual memory system provide the basis from which certain empirical values can be chosen. The driver used with the system of FIG. 2 manages the swap memory 17 as a house. The house contains rooms 20-through-65, divided into floors to best accomplish the task of managing variable length pages. Pages which expand to greater than sixty-five ECC blocks are said to be evicted. For each device of FIG. 2, a separate data file is maintained which is mapped into kernel space during execution so that continuously updated data points may be more efficiently accrued. If the device's data file (known as a tenants file) did not at first exist, then one is created during the device open and filled with the data points obtained from software simulation runs (known as applicants).

The tenants correspond to the number of pages which compress to fit in a particular room. The percentage of potential fits in a room to the total number of rooms is then derived for each tenant, as well as their effective compression ratios. The values BASEMENT and ATHC are established to represent the limits on rooms within the house; popularity establishes the percentage of hits on those rooms; and efficiency establishes the effective compression percentage for each room.

```
#define    BASEMENT    20
#define    ATTIC       65
#define    ROOF        ATTIC + 1
double     tenants[ROOF-BASEMENT];
double     popularity[ROOF-BASEMENT];
double     efficiency[ROOF-BASEMENT];
leases = 0;
for (room = BASEMENT; room < ROOF; room++)
    leases + = tenants[room-BASEMENT];
for (room = BASEMENT; room < ROOF; room++)
{
    popularity[room-BASEMENT] =
            tenants[room-BASEMENT] / leases;
    efficiency[room-BASEMENT] =
            room * (9/8) * (56) / 4096;
}
```

The tenants array always exists and is continuously updated; however, the popularity and efficiency arrays are calculated once on the initial open of the device and are merely place holders until the house is constructed. The floorplan of the house consists of the following:

```
struct    floorplan
{
          long      screen;
          long      window;
          long      door;
          long      front;
          long      back;
          long      area;
          double    efficiency;
          double    popularity;
}model[ROOF-BASEMENT],house[ROOF-BASEMENT];
```

The house was decided to have four floors. Obviously, the more floors, the more effective the storage; however, the program used to size the floors would take longer to run and a desire is to maintain a large first floor for a better first hit percentage. Therefore, a small change in compression is allowed to facilitate a larger change in space.

```
floors  = 4;       /* number of floors */
stax    = 0.020;   /* size tax (compression delta) */
wtax    = 0.080;   /* weight tax (population delta) */
```

The house is constructed using the values above to find the floors which provide the most compression (plus or minus stax) given the largest floor space (plus or minus wtax). All combinations of floor space are analyzed, from .

20-20

21-21

22-22

23-65 to ...

20-61

62-62

63-63

64-65

First, the popularity of all the rooms on a floor are summed and stored in the house. A door is opened between the two rooms joining each floor, while the effective capacity of each floor is computed and summed with that of the previous floor. Suppose the following floors are being analyzed:

20-24

25-36

37-46

47-65

The popularity of rooms 20 through 24 are summed and stored in the house beside the room which divides the floors (room 24). The same is performed for the other three floors, saving the most popular floor. The combined effective compression is computed by summing the products of each floor's efficiency and popularity. The overall effective capacity is thus the physical capacity of the device divided by the total effective compression. The weight of the house is computed as the popularity of the largest floor divided by the total effective compression. Since the goal is to achieve a house with the smallest possible total effective compression and the largest floor, a small increase is allowed in compression for every large increase in population on the most popular floor. An example of a constructed house's floorplan might be as in FIG. 19.

```
The code sequence which accomplishes all this is as follows:
scap = 1.;
scap = 0.;
blueprint(BASEMENT,floors,ATTIC,stax,wtax);
```

```
blueprint(room, floors, attic, stax, wtax)
          long      room;
          long      floors;
          long      attic;
          double    stax;
          double    wtax;
{
          long      a,b;
          double    pop;
          double    iscap;
          double    iwcap;
          if (floors < 2 I I floors > attic - room)
                    return;
          for (a = room+1; a < attic; a++)
          {
                    pop = 0.;
                    for (b = a; b > room I I b == BASEMENT;)
                              pop + = popularity[b--BASEMENT];
                    model[a-BASEMENT].popularity = pop;
                    model[room-BASEMENT].door = a;
                    if (floors > 2)
                    {
                              blueprint(a,floors-1,attic,stax,wtax);
                              continue;
                    }
                    pop = 0.;
                    for (b = attic; b > a; b—)
                              pop + = popularity[b-BASEMENT];
                    model[attic-BASEMENT].popularity = pop;
                    model[a-BASEMENT].door = attic;
                    model[attic-BASEMENT].door = BASEMENT;
                    b = BASEMENT;
```

```
            iscap = 0.;
            pop = 0.;
            while ((b = model[b-BASEMENT].door) != BASEMENT)
            {
                    iscap + = (efficiency[b-BASEMENT] *
                            model[b-BASEMENT].popularity);
                    if (pop < model[b-BASEMENT].popularity)
                            pop = model[b-BASEMENT].popularity;
            }
            iwcap = pop/iscap;
            if (((iwcap > wcap) && (iscap < scap)) ||
                    ((iwcap > wcap - wtax) && (iscap < scap - stax)))
            {
                    scap = iscap;
                    wcap = wcap;
                    do
                            house[b-BASEMENT] = model[b-
BASEMENT];
                    while ((b = model[b-BASEMENT].door) !=
BASEMENT);
            }
    }
}
```

The floors are next furnished and sorted by popularity--the most popular floor being addressed first.
        floorsort(BASEMENT);

```
floorsort(basement)
        long                    basement;
{
        double                  lpopularity, rpopularity;
        long                    lroom, mroom, rroom;
        while ((lroom = house[basement-BASEMENT].door) !=
                                        BASEMENT)
        {
                lpopularity = house[lroom-BASEMENT].popularity;
                mroom = lroom;
                rroom = house[mroom-BASEMENT].door;
                if (rroom = = BASEMENT)
                        break;
                rpopularity = house[rroom-BASEMENT].popularity;
                while (lpopularity >= rpopularity)
                {
                        mroom = rroom;
                        rroom = house[mroom=BASEMENT].door;
                        if (rroom == BASEMENT);
                                break;
                        rpopularity =
                                house[rroom-BASEMENI].popularity;
                }
                house[basement-BASEMENT].door = rroom;
                house[mroom-BASEMENT].door =
                        house[rroom-BASEMENT].door;
                house[rroom-BASEMENT].door = lroom;
        }
        if (rroom == BASEMENT)
                basement = lroom;
        }
}
```

From FIG. 20 it can be seen that the first floor occupies rooms 25 through 36, the second floor occupies rooms 20 through 24, and so on. For instance, all pages which can compress to less than or equal to 36 ECC blocks and greater than 24 blocks are addressed in the range 0 through 32325632. The area maintained by a floor is computed as the total effective capacity of the device divided by the effective capacity of that floor.

```
ecap = pcap / scap;
lcap = 0;
room = BASEMENT;
while ((room = house[(door=room)-BASEMENT].door)!= BASEMENT)
{
        house[room-BASEMENT].capacity =
                (efficiency[room-BASEMENT] *
                house[room-BASEMENT].popularity);
```

```
            house[room-BASEMENT].efficiency =
                    efficiency[room-BASEMENT];
            house[room-BASEMENT].area = (long)roundoff((ecap *
                    house[room-BASEMENT].popularity),
                    (double)(0-4096);
            lcap += (double)house[room-BASEMENT].area;
            house[room-BASEMENT].front =
                    house[door-BASEMENT].front +
                    house[door-BASEMENT].area;
            house[room-BASEMENT].back =
                    house[room-BASEMENT].front +
                    house[room-BASEMENT].area -
                    (long)4096;
}
```

The front/back address range marks the storage location in memory 17 in 8-bit data bytes, and thus correlates exactly to a page aligned system address offset. When the system needs to address the memory 17, the driver must know the correct floor to assign since the efficiency and room number are needed to compute the address needed by the memory controller 57 hardware. In order to find the correct floor quickly, the driver maintains a list of screens which have been computed by dividing up the total logical capacity of the device among all the rooms and assigning the appropriate floor to those rooms based on the area consumed by the floor. Thus, a system address is merely divided by the same divisor and used as the index into the house. The screen value within that entry points to the correct floor. If however, the actual address is greater than the value of the back for that floor, then the room number is simply increased by one.

mechanism 16 returns the actual compressed size in 9-bit ECC bytes. Therefore, the driver need only to divide the value by the size of an ECC block and index to the correct window via the result. The value of the window marks the start of the next accommodating floor.

```
repair = (lcap - 4096) / (ATTIC-BASEMENT);
door = house[BASEMENT-BASEMENT].door;
start = house[door-BASEMENT].front;
for (room = BASEMENT-BASEMENT; room < ROOF-BASEMENT;
                        room++)
{
        while (((room * repair) + start) >
                (house[door-BASEMENT].back))
                door = house[door-BASEMENT].door;
        house[room].screen = door;
}
```

A similar procedure is used whenever the initial transfer did not fit on the floor initially attempted. The compression

```
windowsort(ROOF);
```

```
windowsort(roof)
        long            roof;
{
        long            curtain;
        long            window      = BASEMENT;
        long            room        = BASEMENT;
        while ((room = house[room-BASEMENT].door) != BASEMENT)
                if (window == BASEMENT)
                        return;
        curtain = window;
        while (curtain > = BASEMENT)
                house[curtain---BASEMENT].window = window;
        windowsort(window);
}
```

In an alternative embodiment, if the hard disk 14 is used for storing uncompressible pages, all data pages sent via bus 12 for storage may be conditionally stored as uncompressed data on disk 14, while at the same time the page is being compressed in mechanism 26. After the compression operation has been completed then if the level of compression produces a page smaller than the 2800-byte limit or the 2000-byte limit the page is stored again as compressed data in the partition 18 or 19 in the memory 17, and the just-stored page of uncompressed data on the disk 14 is invalidated. Invalidating the uncompressed page merely consists of resetting a bit a page address table in the controller 15 to "empty".

While this invention has been described with reference to specific embodiments, this description is not meant to be construed in a limiting sense. Various modifications of the disclosed embodiments, as well as other embodiments of the invention, will be apparent to persons skilled in the art upon reference to this description. It is therefore contemplated that the appended claims will cover any such modifications or embodiments as fall within the true scope of the invention.

What is claimed is:

1. A memory device for storing pages of data, the pages of data being of fixed size, said memory device comprising:
    a) a first set of a plurality of memory spaces of said fixed size, said memory spaces of said first set storing an uncompressed version of one of said pages of data;
    b) a second set of a plurality of memory spaces smaller than said fixed size of said memory spaces, said memory spaces of said second set storing a compressed form of one of said pages of data;
    c) means for compressing each of said pages of data to produce a plurality of compressed pages, and means for detecting if a compressed page is smaller than a memory space of said second set; and
    d) means for selectively storing a compressed page of data in a memory space of said second set as said compressed version if the compressed page is smaller than a memory space of said second set, in response to said means for detecting; and
    including means for generating at least one error-correcting code for each one of each of said compressed pages, and wherein said means for selectively storing a compressed page of data in a memory space of said second set stores said error-correcting codes with said compressed pages; and including means for transferring said compressed pages as parallel 9-bit symbols to said means for generating an error-correcting code.

2. A memory device for storing pages of data, the pages of data being of a fixed size of bytes, said memory device comprising:
    a) a first set of a plurality of memory spaces of said fixed size, said memory spaces of said first set storing an uncompressed version of one of said pages of data;
    b) a second set of a plurality of memory spaces smaller than said fixed size of said memory spaces, said memory spaces of said second set storing a compressed form of one of said pages of data;
    c) means for compressing each of said pages of data to produce a plurality of compressed pages, and means for detecting if a compressed page is smaller than a memory space of said second set; and
    d) means for selectively storing a compressed page of data in a memory space of said second set as said compressed version if the compressed page is smaller than a memory space of said second set, in response to said means for detecting; and
    wherein said means for compression includes a lookahead buffer storing a first number of bytes of one of the pages of data, and includes a window buffer containing a second number of bytes of the one of the pages of data, said second number being larger than said first number, and means for comparing the first number of bytes in said lookahead buffer to all of the second number of the bytes in said window buffer and generating match symbols if multiple-byte matches are found in said comparing.

3. The memory device according to claim 2 wherein said lookahead buffer and said window buffer are of bit-parallel format, and said means for compressing has an output which includes an added bit that indicates whether or not said output of the means for compressing represents a compressed or non-compressed symbol.

* * * * *